(12) United States Patent
Lin

(10) Patent No.: US 12,706,154 B2
(45) Date of Patent: Aug. 11, 2026

(54) SELECT GATE SELECTIVE TOUCH UP ADJUSTMENT

(71) Applicant: Micron Technology, Inc., Boise, ID (US)

(72) Inventor: Lei Lin, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 163 days.

(21) Appl. No.: 18/818,238

(22) Filed: Aug. 28, 2024

(65) Prior Publication Data

US 2026/0065996 A1 Mar. 5, 2026

(51) Int. Cl.

| | |
|---|---|
| ***G11C 16/10*** | (2006.01) |
| ***G11C 16/26*** | (2006.01) |
| ***G11C 16/32*** | (2006.01) |
| ***G11C 16/34*** | (2006.01) |

(52) U.S. Cl.

CPC ............ *G11C 16/102* (2013.01); *G11C 16/26* (2013.01); *G11C 16/32* (2013.01); *G11C 16/3404* (2013.01)

(58) Field of Classification Search

CPC ....... G11C 16/102; G11C 16/26; G11C 16/32; G11C 16/3404

USPC ........................................................ 365/211

See application file for complete search history.

(56) References Cited

U.S. PATENT DOCUMENTS 8,964,474 B2 2/2015 Morooka et al.
2025/0053317 A1* 2/2025 Kim ...................... G06F 3/0679

* cited by examiner

*Primary Examiner* — Fernando Hidalgo

(74) *Attorney, Agent, or Firm* — Schwegman Lundberg & Woessner, P.A.

(57) ABSTRACT

An apparatus that includes a set of memory components of a memory sub-system is disclosed for selectively adjusting a touch up program pulse of an SG. The memory sub-system includes a processing device that detects a condition for performing a select gate (SG) scan for a set of SGs associated with a set of memory components of a memory sub-system. The processing device, in response to detecting the condition for performing the SG scan, accesses data associated with a plurality of memory cells of the set of memory components coupled to an individual SG of the set of SGs. The processing device adjusts a touch up (TU) program pulse based on the accessed data associated with the plurality of memory cells and applies the adjusted TU program pulse to the individual SG to place a threshold voltage (Vt) of the individual SG within a specified operating range.

20 Claims, 13 Drawing Sheets

904
912
WORK-LOAD FROM HT TO RT
1
1
HT
2
914
RT

| NO. | COUNTS AND TAMP. | TU VPGM OR/AND LOOPS |
|---|---|---|
| 1 | $[C_0, C_1)$ AND $[T_0, T_1)$ | $TU_1$ |
| 2 | $[C_1\ C_2)$ AND $[T_1, T_2)$ | $TU_2$ |
| ....... | ....... | ....... |

| NO. | PERCENTAGE AND RATIO | TU VPGM OR/AND LOOPS |
|---|---|---|
| 1 | $[P_0, P_1)$ AND $[R_0, R_1)$ | $TU_2 = TU_{DEF} \times P_{01} \times R_{01}$ |
| 2 | $[P_1, P_2)$ AND $[R_1, R_2)$ | $TU_2 = TU_{DEF} \times P_{12} \times R_{12}$ |
| ....... | ....... | ....... |

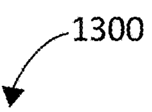

DETECT A CONDITION FOR PERFORMING A SELECT GATE (SG) SCAN FOR A SET OF SGS ASSOCIATED WITH A SET OF MEMORY COMPONENTS OF A MEMORY SUB-SYSTEM 1302

IN RESPONSE TO DETECTING THE CONDITION FOR PERFORMING THE SG SCAN, ACCESS DATA ASSOCIATED WITH A PLURALITY OF MEMORY CELLS OF THE SET OF MEMORY COMPONENTS COUPLED TO AN INDIVIDUAL SG OF THE SET OF SGS 1304

ADJUST A TOUCH UP (TU) PROGRAM PULSE BASED ON THE ACCESSED DATA ASSOCIATED WITH THE PLURALITY OF MEMORY CELLS 1306

APPLY THE ADJUSTED TU PROGRAM PULSE TO THE INDIVIDUAL SG TO PLACE A THRESHOLD VOLTAGE (VT) OF THE INDIVIDUAL SG WITHIN A SPECIFIED OPERATING RANGE 1308

FIG. 13

SELECT GATE SELECTIVE TOUCH UP ADJUSTMENT

TECHNICAL FIELD

Examples of the disclosure relate generally to memory sub-systems and, more specifically, to performing select gate (SG) touch up operations in a memory sub-system.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data on the memory components and to retrieve data from the memory components.

BRIEF DESCRIPTION OF THE DRAWINGS

The present disclosure will be understood more fully from the detailed description given below and from the accompanying drawings of various examples of the disclosure.

FIG. 13 is a flow diagram of an example method to perform SG touch up operations, in accordance with some examples.

DETAILED DESCRIPTION

Figure 1:
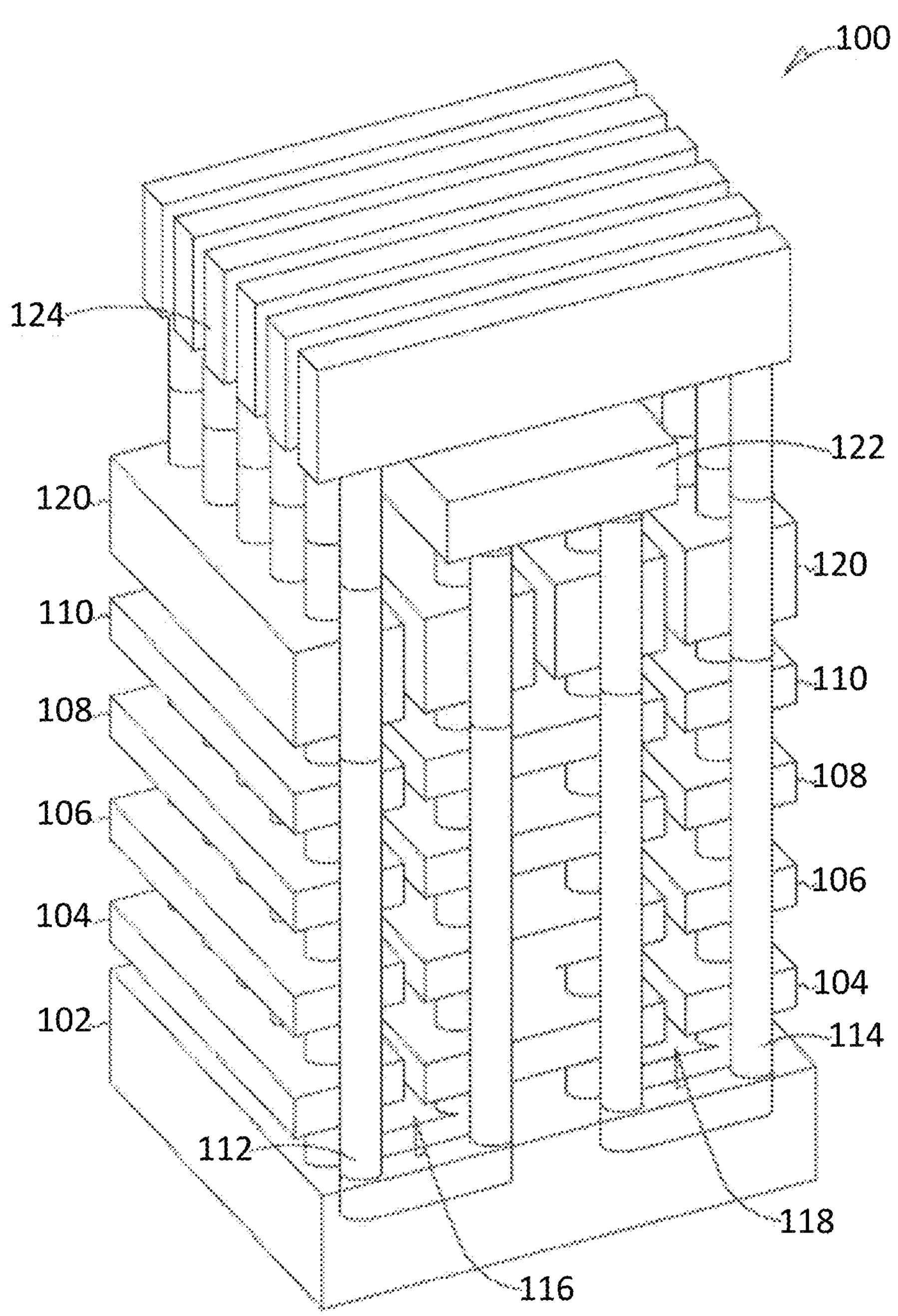
FIG. 1 illustrates an example three-dimensional view of a 3D NAND architecture semiconductor memory device.

The present disclosure configures a system component, such as a memory sub-system processor or controller, such as an SG touch up component or module, to selectively and intelligently adjust a touch up program pulse that is applied to different SGs of the memory sub-system. Particularly, the processor can determine that a condition is satisfied for performing an SG scan and/or for applying a touch up (TU) program pulse to one or more SGs. The condition can be satisfied when a threshold voltage (Vt) distribution of a set of SGs is close or within a threshold distance or amount to a lower or upper bound of a specified operating range for the Vt (e.g., prior to reaching a high temperature threshold) and/or when a temperature is above the high temperature threshold and is unlikely to drop below the high temperature threshold within a threshold time interval. In such cases or periodically, the processor can obtain data associated with memory cells coupled to one or more SGs. The processor can then dynamically compute or retrieve a TU program pulse value based on the obtained data. This way, different TU program pulse adjustments can be performed for SGs associated with different memory blocks and/or memory dies which reduces errors in data stored by the memory sub-system. This improves the overall efficiency of operating and implementing the memory sub-system.

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random access memory (DRAM), or synchronous dynamic random access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase change random access memory (PCRAM), resistive random access memory (RRAM), or magnetoresistive random access memory (MRAM), among others. Flash memory is utilized as non-volatile memory for a wide range of electronic applications. Flash memory devices typically include one or more groups of one-transistor, floating gate memory cells that allow for high memory densities, high reliability, and low power consumption, and/or replacement-gate (RG) NAND devices.

Two common types of flash memory array architectures include NAND and NOR architectures, named after the logic form in which the basic memory cell configuration of each is arranged. The floating gate memory cells of the memory array are typically arranged in a matrix. The gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a column of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a select gate drain-side (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series-coupled group, restricted only by the selected memory cells of each group, placing current-encoded data values of the row of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. However, flash memory cells can also represent one of more than two programmed states, allowing the manufacture of higher density memories without increasing the number of memory cells, as each cell can represent more than one binary digit (e.g., more than one bit, such as 1-bit, 2-bit, or 4-bits). Such cells can be referred to as multi-state memory cells, multi-digit cells, or multi-level cells (MLCs). In certain examples, MLC can refer to a memory cell that can store two bits of data per cell (e.g., one of four programmed states), and a triple-level cell (TLC) can refer to a memory cell that can store three bits of data per cell (e.g., one of eight programmed states). In other examples, MLC can refer to any memory cell that can store more than one bit of data per cell, or can represent one of more than two programmed states.

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Memory arrays or devices can be combined together to form a storage volume of a memory sub-system, such as a solid state drive (SSD). An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other electromechanical delay associated with magnetic disk drives. SSDs may also use non-volatile flash memory cells to obviate internal battery supply requirements, thus allowing the drive to be more versatile and compact.

An SSD can include a number of memory devices (e.g., memory components), including a number of dies or logical units (LUNs). Each die can include a number of memory arrays and peripheral circuitry thereon, and the memory arrays can include a number of memory blocks of memory cells organized into a number of physical pages. The SSD can receive commands from a host in association with memory operations, such as read or write operations to transfer data (e.g., user data and associated integrity data, such as error data and address data, etc.) between the memory devices and the host, or erase operations to erase data from the memory devices.

In three-dimensional (3D) architecture semiconductor memory technology, as the number of tiers of a memory device increases, such as by stacking vertical structures, the number of physical pages, sub-blocks, or blocks in the memory device will increase. As the number of physical pages, sub-blocks, or blocks increases, the number of string drivers required to drive the memory cells of the memory device will increase. A vertical decoder structure can be configured to reduce the number of string drivers required for a 3D memory structure, while reducing power consumption and, in certain examples, lowering current requirements and reducing the block size for each individual string driver.

There are challenges in efficiently managing or performing media management operations on typical 3D memory devices (e.g., 3D architecture semiconductor memory) and other memory devices and sub-systems that utilize SGs to read/write data to corresponding memory cells. Specifically, certain memory sub-systems that incorporate replacement gate (RG) NAND structures use the SGs that can be erased and reprogrammed. The SGs typically need to be scanned and monitored periodically from the source side (e.g., SGS) and the SGD to ensure that the Vt is within a safe operating range. This process is known as an SG scan.

SG scan usually includes a low voltage scan (LVT) and a high voltage scan (HVT). If the LVT scan is successfully (e.g., the Vt distribution) computed by applying the low voltage to the SGS/SGD, the SG scan terminates. If the LVT scan fails, a predetermined TU program pulse is applied to one or more SGs to modify the charge distribution of charges trapped in a tunnel of the SGs. Then, the LVT scan is again performed along with a HVT to verify whether the Vt distribution of the SGs is now within a normal operating range. However, applying a predetermined TU program pulse (e.g., program pulse with a predetermined trim set) to all of the SGs may result in suboptimal improvements. Specifically, applying the predetermined TU program pulse may cause some SGs to have their respective Vt distribution fall entirely within the normal operating range while causing others to partially fall within the normal operating range. This can introduce read errors and reduce the overall efficiency and operating speed of the memory sub-systems. Applying a one-size-fits-all approach to the TU programming pulse can reduce the efficiency of operating the memory sub-system. Also, applying the predetermined TU program pulse without considering a current operating temperature of the memory sub-system can increase the likelihood that the adjusted Vt distribution will fall outside of the normal operating range. Some systems blindly skip performing TU adjustments when the memory sub-system operates at a temperature that exceeds a high temperature threshold but doing so can cause additional errors to be introduced. Namely, if the temperature remains high for too long, there may be issues recovering the Vt distribution of the SGs to the normal operating range as such approaches fail to consider block-to-block and die-to-die variations and the movement and placement of charges varying over time.

The present disclosure addresses the above and other deficiencies by providing an SG touch up component or module that selectively and intelligently adjusts the TU program pulse that is applied to different SGs of the memory sub-system. Particularly, the SG touch up component can determine that a condition is satisfied for performing an SG scan and/or for applying a touch up (TU) program pulse to one or more SGs. The condition can be satisfied when a threshold voltage (Vt) distribution of a set of SGs is close or within a threshold distance or amount to a lower or upper bound of a specified operating range for the Vt (e.g., prior to reaching a high temperature threshold) and/or when a temperature is above the high temperature threshold and is unlikely to drop below the high temperature threshold within a threshold time interval. In such cases or periodically, the SG touch up component can obtain data associated with memory cells coupled to one or more SGs. The SG touch up component can then dynamically compute or retrieve a TU program pulse value based on the obtained data. This way, different TU program pulse adjustments can be performed for SGs associated with different memory blocks and/or memory dies which reduces errors in data stored by the memory sub-system. This improves the overall efficiency of operating and implementing the memory sub-system. This innovative approach enables the NAND system to gather and analyze the in-field Vt distribution of SG cells using SG Vt scans. By combing this data with the temperature information, the system dynamically adjusts the trim values in the TU program pulse, ensuring precise placement of SG Vts within the desired range.

The disclosed techniques can be helpful in memory sub-systems, such as SSDs, that are used in data centers, data centers with artificial intelligence (AI) applications and systems, automotive applications, client personal computers, mobile devices, and so forth. The disclosed techniques particularly improve performance of operating AI applications on any such devices and systems that operate in high temperature conditions.

In some examples, a processing device coupled to the set of memory components is configured to perform operations including detecting a condition for performing a select gate (SG) scan for a set of SGs associated with the set of memory components. The processing device, in response to detecting the condition for performing the SG scan, accesses data associated with a plurality of memory cells of the set of memory components coupled to an individual SG of the set of SGs and adjusts a touch up (TU) program pulse based on the accessed data associated with the plurality of memory cells. The processing device applies the adjusted TU program pulse to the individual SG to place a threshold voltage (Vt) of the individual SG within a specified operating range.

In some cases, the specified operating range includes a lower bound and an upper bound. In such cases, the processing device obtains the Vt of the individual SG that was determined when a temperature of the memory sub-system was below a high temperature threshold. The processing device determines that the obtained Vt is less than a threshold amount from the lower bound of the specified operating range and, in response to determining that the obtained Vt is less than the threshold amount from the lower bound of the specified operating range, determines that the condition for performing the SG scan is satisfied.

The processing device can adjust the TU program pulse before the temperature of the memory sub-system reaches the high temperature threshold. The processing device can select between performing a soft TU program pulse adjustment and strong TU program pulse adjustment based on a Vt distribution of the individual SG while the temperature of the memory sub-system is below the high temperature threshold. Namely, the processing device can selectively adjust the TU program pulse while a temperature of the memory sub-system is above a high temperature threshold.

The processing device can determine a Vt distribution of the individual SG while the temperature of the memory sub-system is above the high temperature threshold. In response to determining that more than a threshold amount of the Vt distribution of the individual SG is outside of the specified operating range, the processing device determines that the condition is satisfied for adjusting the TU program pulse while the temperature of the memory sub-system is above the high temperature threshold. In some cases, the processing device determines a Vt distribution of the individual SG while the temperature of the memory sub-system is above the high temperature threshold, and in response to determining that less than a threshold amount of the Vt distribution of the individual SG is outside of the specified operating range, selectively delays adjusting the TU program pulse while the temperature of the memory sub-system is above the high temperature threshold. The processing device can determine whether the temperature of the memory sub-system that is above the high temperature threshold will be below the high temperature threshold within a threshold period of time.

The processing device, in response to determining that the temperature of the memory sub-system is above the high temperature threshold and will be below the high temperature threshold within the threshold period of time, delays adjusting the TU program pulse until the temperature of the memory sub-system is below the high temperature threshold. In some cases, the processing device, in response to determining that the temperature of the memory sub-system is above the high temperature threshold and will not be below the high temperature threshold within the threshold period of time, adjusts the TU program pulse without delaying.

In some examples, the processing device obtains a first temperature corresponding to a current temperature of a portion of the memory sub-system from a temperature sensor. The processing device initializes a timer and determines that the timer has reached a threshold value. The processing device, in response to determining that the timer has reached the threshold value, obtains a second temperature corresponding to the current temperature of the portion of the memory sub-system from the temperature sensor and compares the first temperature with the second temperature. The processing device determines that the second temperature is lower than the first temperature by more than a threshold amount and, in response to determining that the second temperature is lower than the first temperature by more than the threshold amount, determines that the temperature of the memory sub-system that is above the high temperature threshold will be below the high temperature threshold within the threshold period of time.

In some cases, the processing device reads data from the plurality of memory cells coupled to the individual SG prior to adjusting the TU program pulse. The processing device determines a quantity of cell bits of the plurality of memory cells that pass the SG scan based on reading the data. The processing device accesses a table that associates different ranges of cell bits that pass the SG scan with respective TU program pulse adjustment values and determines that the quantity of cell bits that pass the SG scan correspond to a first range of cell bits in the table. The processing device obtains a TU program pulse adjustment value associated with the first range and adjusts the TU program pulse that is applied to the individual SG based on the obtained TU program pulse adjustment. In some cases, the quantity of cell bits is computed as a total count or as a percentage of a total number of cells in the plurality of memory cells and different TU program pulse adjustments are applied to different SGs of the set of SGs corresponding to different memory blocks or memory dies.

In some cases, the processing device reads a temperature associated with the individual SG prior to adjusting the TU program pulse and adjusts the TU program pulse based on the temperature. The processing device accesses a table that associates different ranges of temperatures with respective TU program pulse adjustment values and determines that the temperature associated with the individual SG corresponds to a first range of cell bits in the table. The processing device obtains a TU program pulse adjustment value associated with the first range and adjusts the TU program pulse that is applied to the individual SG based on the obtained TU program pulse adjustment. The temperature can be computed as an actual value read from a temperature sensor or as a ratio of the actual value read to a threshold temperature value. The memory sub-system can include three-dimensional (3D) NAND memory structures. The memory sub-system can include replacement-gate (RG) NAND devices.

The processing device can read data from the plurality of memory cells coupled to the individual SG prior to adjusting the TU program pulse and determine a quantity of cell bits of the plurality of memory cells that pass the SG scan based on reading the data. The processing device can read a temperature associated with the individual SG prior to adjusting the TU program pulse and access a table that associates different ranges of temperatures and different ranges of cell bits that pass the SG scan with respective TU program pulse adjustment values. The processing device obtains a TU program pulse adjustment value associated with an individual range in the table based on the read temperature and the determined quantity of cell bits and adjusts the TU program pulse that is applied to the individual SG based on the obtained TU program pulse adjustment.

FIG. 1 illustrates an example 3D view of a 3D NAND architecture semiconductor memory device 100 on a substrate 102 according to various examples, depicting functional structures defining the architecture, including access lines (e.g., word lines) 104, 106, 108, 110; U-shaped pillars 112, 114; select gates 120; a source line 122; and data lines (e.g., bit lines) 124. Memory device 100 represents a portion of a greater number of similar structures that would typically be found in a block, device, or other unit of NAND memory. While the disclosed techniques are described with references to the memory device 100, similar approaches can be applied to any other memory device that uses a SG to control access (read/write) to multiple memory cells in an array.

The example memory device 100 includes multiple tiers of memory structures, including first, second, third, and fourth access lines 104, 106, 108, 110 that at least partially surround charge storage structures (e.g., floating gates) of respective pluralities of charge storage transistors (e.g., memory cells), each including a source, a drain, and a control gate. In the memory device 100 illustrated in FIG. 1, each of the separate first, second, third, and fourth access lines 104, 106, 108, 110 are located at separate tiers of the memory device 100. Although shown with four tiers of access lines in FIG. 1 for purposes of illustration, in various examples in actual devices, the memory device 100 can include a greater number of tiers of access lines, such as 8, 16, 32, 64, etc. In some examples, the charge storage structures of the memory device 100 include replacement-gate (RG) NAND devices.

The memory device 100 can include a plurality of U-shaped pillars that function as channels for the charge storage transistors. Although illustrated as having 12 U-shaped pillars in FIG. 1 for purposes of illustration, including first and second U-shaped pillars 112, 114, the memory device 100 can include more or fewer U-shaped pillars, as desired. Each of the first and second U-shaped pillars 112, 114 can extend into the substrate 102, and can be separated by first or second vertical slots 116, 118, respectively. The first and second U-shaped pillars 112, 114 can include a semiconductor material, such as polysilicon, which in many examples will be formed as a tube (hollow cylinder) of polysilicon defining a central aperture, with a dielectric material filling the aperture.

The memory device 100 can include select transistors (e.g., SG transistors) formed at each end of the first and second U-shaped pillars 112, 114, and select gates 120 surrounding the select transistors. The source line 122 can be formed on the select transistors at first ends of the first and second U-shaped pillars 112, 114, and the data lines (e.g., bit lines) 124 can be formed on the select transistors at second ends of the first and second U-shaped pillars 112, 114.

In certain examples, one or more of the tiers of semiconductor material can function as a body of a peripheral transistor, such as a decoder transistor, driver, or one or more other peripheral circuits for the memory device 100.

Although illustrated in FIG. 1 using U-shaped pillars 112, 114, the 3D NAND architecture semiconductor memory device 100 can, in other examples, be formed in one or more other shapes of pillars, including substantially vertical (and not U-shaped) pillars having source and data lines at respective first and second ends. Further, in certain examples, the memory device 100 can include multiple vertical structures stacked upon one another, such as illustrated in the commonly assigned U.S. Pat. No. 8,964,474, issued to Midori Morooka et al., and titled "Architecture for 3-D NAND Memory," incorporated by reference herein in its entirety, including its disclosure of stacked arrays of memory cell strings and respective methods of operation.

Figure 2:
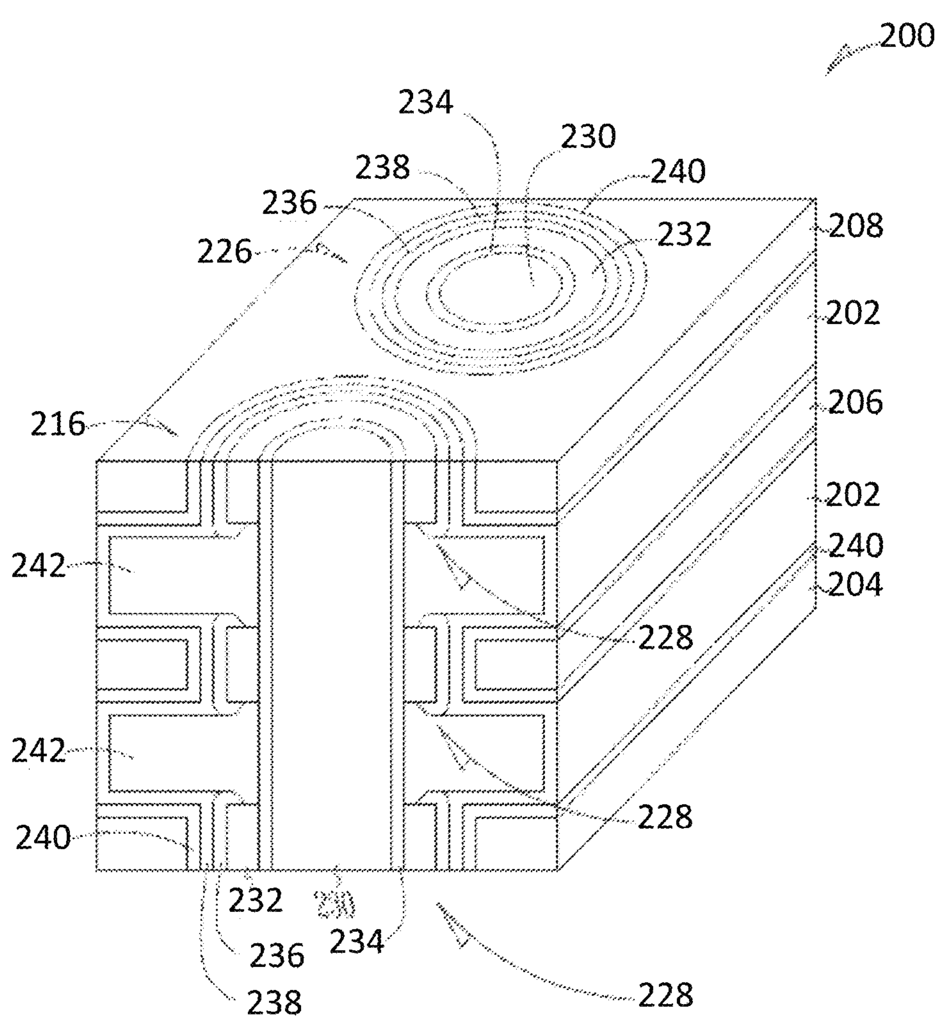
FIG. 2 illustrates an example three-dimensional view of a 3D NAND architecture semiconductor memory device.

FIG. 2 illustrates an example 3D cross section of a 3D NAND architecture semiconductor memory device 200, including portions of second and third pillars (e.g., U-shaped pillars) 216, 226, first, second, and third access lines 202, 204, 206, 208, and memory cells 228.

Each of the second and third pillars 216, 226 includes a conductive structure 230, such as a semiconductor material, such as polysilicon. In many examples, the polysilicon can define a central aperture, which can be filled with a dielectric material. The portions of the second and third pillars 216, 226 illustrated in FIG. 2 include three individual memory cells 228. Each 3D memory cell 228 includes a volume of semiconductor material, such as, in many examples, a partial ring structure 232 (e.g., p+ type polysilicon, etc.) that functions as a floating gate, separated from the polysilicon of the second and third pillars 216, 226 by a tunnel dielectric 234, and from respective first, second, or third access lines 204, 206, 208 by one or more inter-poly dielectric layers, such as an oxide-nitride-oxide (ONO) structure, including, for example, a first silicon dioxide ($SiO_2$) layer 236, a silicon nitride ($Si_3N_4$) layer 238, and a second dioxide layer 240. The respective memory cells 228 are separated from each other by additional tiers of dielectric material 242.

Whereas the memory cells 228 in FIG. 2 include floating gate storage structures, in other examples, other charge storage mechanisms may be utilized, such as charge trapping structures or other forms of storage structures.

Figure 3:
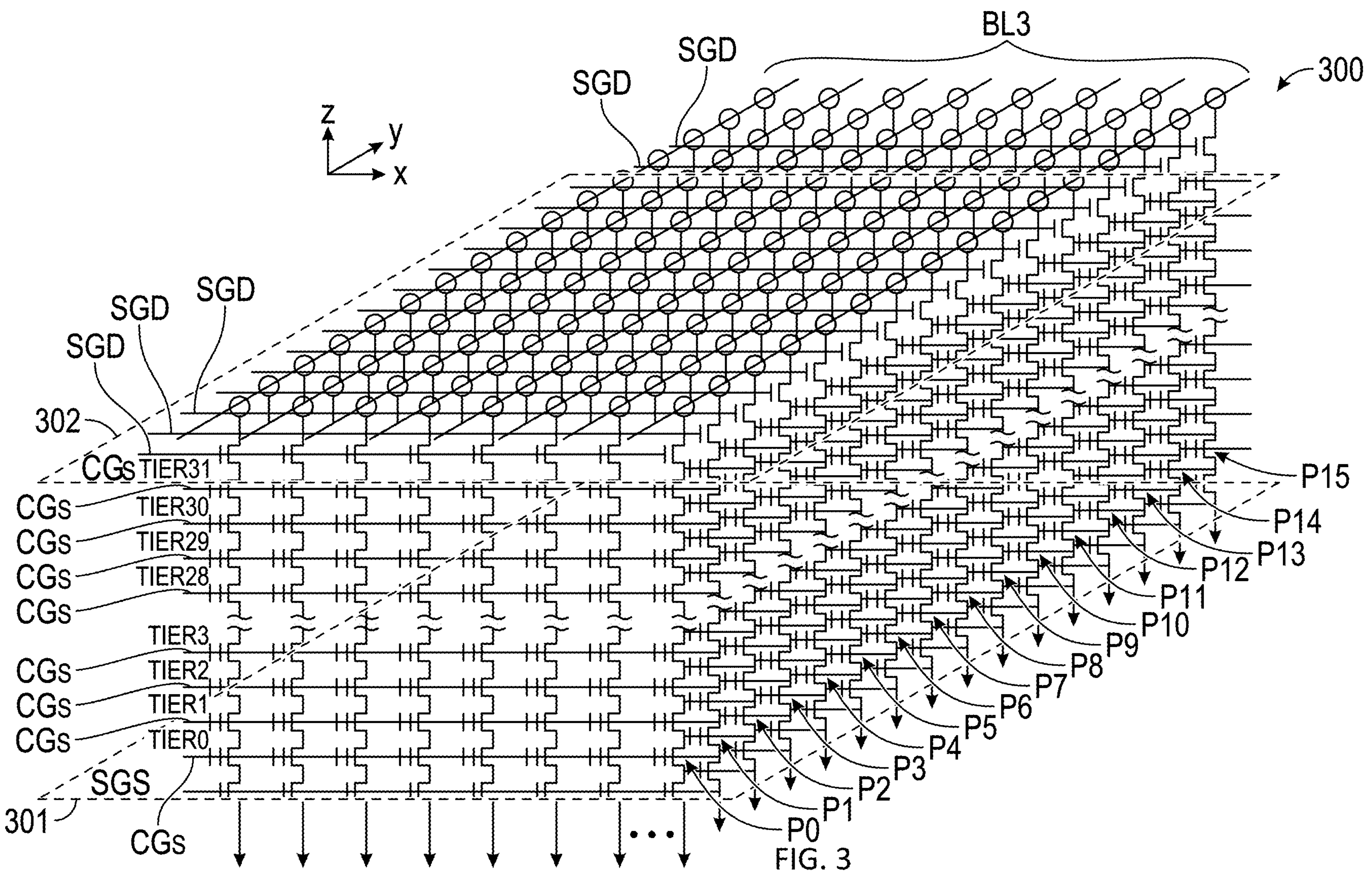
FIG. 3 to FIG. 4 illustrate example schematic diagrams of a 3D NAND architecture semiconductor memory array.

FIG. 3 illustrates an example schematic diagram of a 3D NAND architecture semiconductor memory array 300 including a plurality of strings of memory cells, each string including 32 tiers (TIER0-TIER31) of charge storage transistors stacked in the Z direction, source to drain, from a source-side select gate (SGS) to a drain-side select gate (SGD). Each string of memory cells in the 3D memory array 300 can be arranged along the Y direction as data lines (e.g., bit lines (BL)), and along the X direction as physical pages (P0-P15). Within a physical page (e.g., P0), each tier represents a row of memory cells, and each string of memory cells represents a column. A block of memory cells can include a number of physical pages (e.g., 128, 384, etc.). In other examples, each string of memory cells can include more or less tiers (e.g., 8, 16, 64, 128, etc.), as well as one or more additional tiers of semiconductor material above or below the charge storage transistors (e.g., select gates, data lines, etc.), as desired.

Each memory cell in the memory array 300 includes a control gate coupled to (e.g., electrically or otherwise operatively connected to) an access line (e.g., word line), which collectively couples the control gates across a specific tier, or a portion of a tier, as desired. Specific tiers in the 3D memory array 300, and accordingly, specific memory cells in a string, can be accessed or controlled using respective access lines. For example, the memory array 300 includes a first level of semiconductor material 302 (e.g., polysilicon, etc.) that couples the control gates of each memory cell in TIER31, and a second level of semiconductor material 304 that couples the source-side select gates (SGS) of the array 300. Similar levels of metal or semiconductor material can couple the control gates for each tier. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 4:
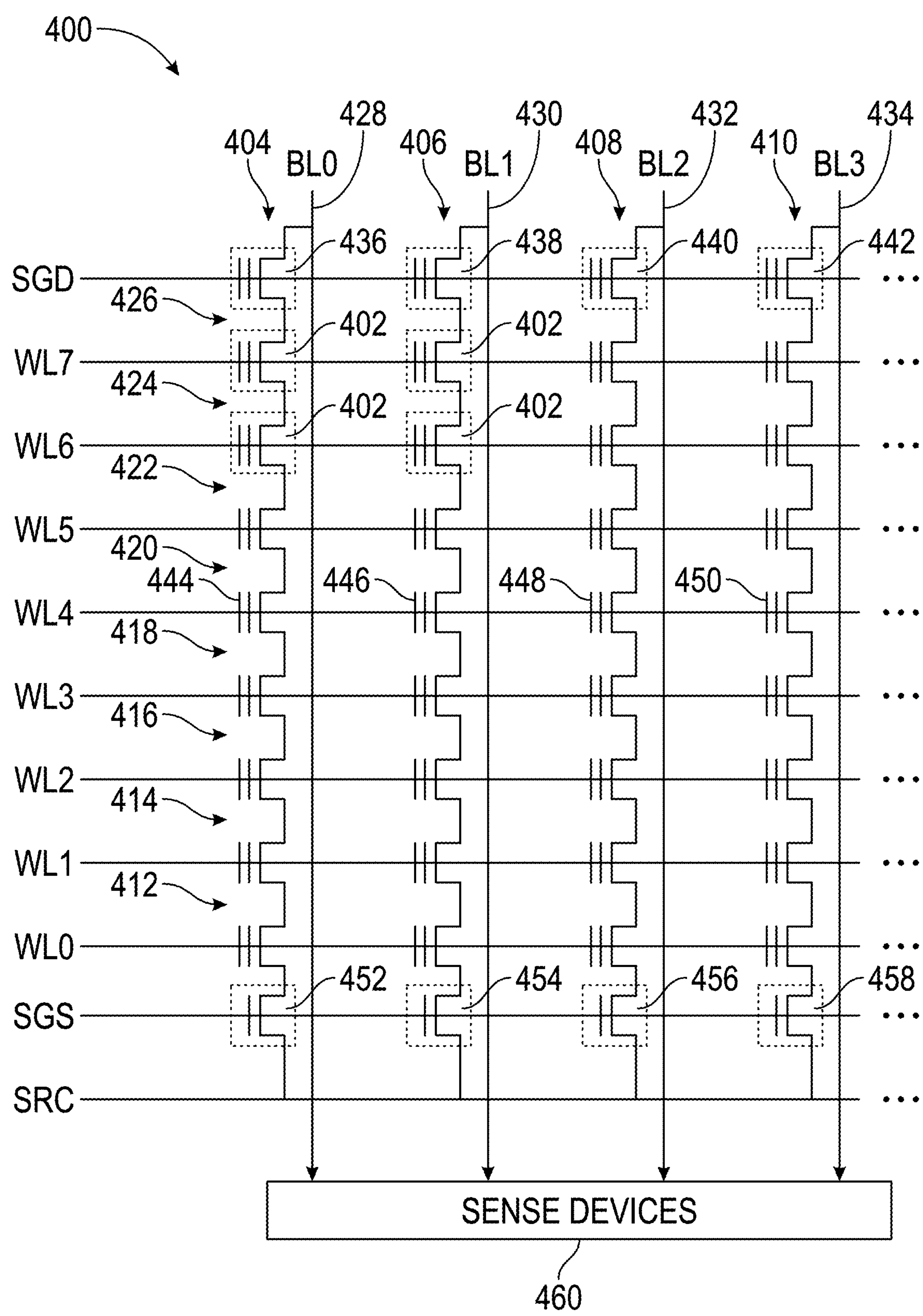

FIG. 4 illustrates an example schematic diagram of a portion of a 3D NAND architecture semiconductor memory array 400 including a plurality of memory cells 402 arranged in a two-dimensional array of strings (e.g., first, second, third, and first string 404, 406, 408 and 410) and tiers (e.g., TIER0-TIER7 412-426), and sense amplifiers or devices 460. For example, the memory array 400 can illustrate an example schematic diagram of a portion of a physical page of memory cells of a 3D NAND architecture semiconductor memory device. Each string of memory cells is coupled to a source line (SRC) using a respective source-side select gate (SGS) (e.g., first, second, third, or first SGS 452-458), and to a respective data line (e.g., first, second, third, or fourth bit lines (BL0-BL3) 428-434) using a respective drain-side select gate (SGD) (e.g., first, second, third, or first SGD 436, 438, 440, and 442). Although illustrated with 8 tiers (TIER0-TIER7 412-426, e.g., using word lines (WL) WL0-WL7) and 4 data lines (BL0-BL3 428-434) in the example of FIG. 4, other examples can include strings of memory cells having more or fewer tiers (e.g., 16, 32, 64, etc.) or data lines, as desired.

In a NAND architecture semiconductor memory array, such as the example memory array 400, the state of a selected memory cell can be accessed by sensing a current or voltage variation associated with a particular data line containing the selected memory cell. The memory array 400 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL3), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first, second, third, or first control gate 444, 446, 448, and 450 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, such as, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 460, coupled to one or more of the data lines (e.g., first, second, third, or fourth bit lines (BL0-BL3) 428-434), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 5:
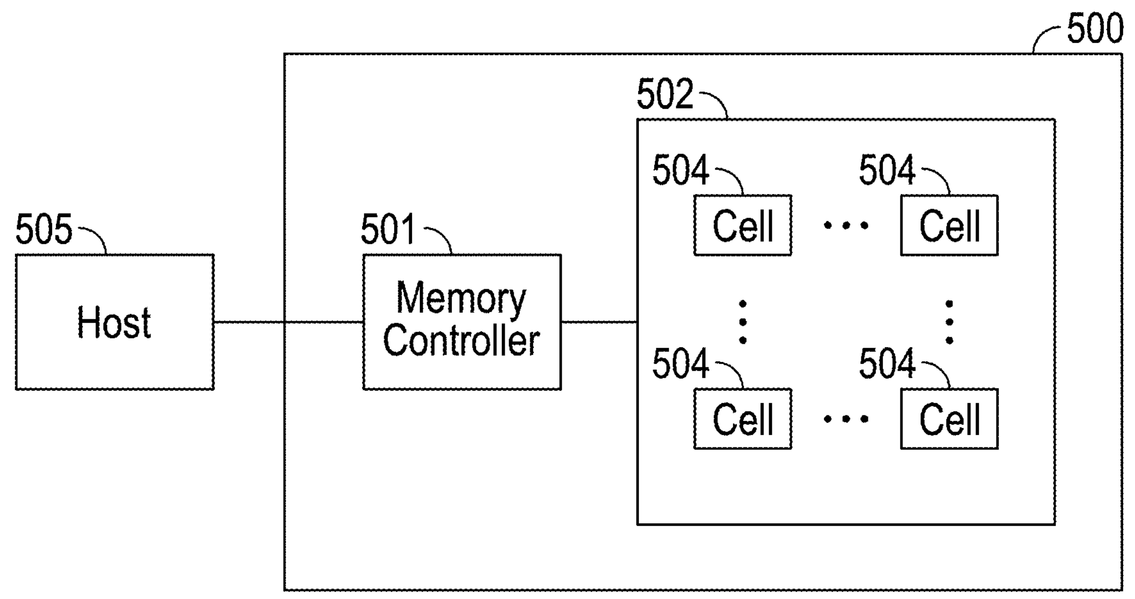
FIG. 5 illustrates an example block diagram of a memory device.

FIG. 5 illustrates an example block diagram of a memory device 500 including a memory controller 501 and a memory array 502 having a plurality of memory cells 504, and a host 505 external to the memory device 500. One or more physical interfaces can be used to transfer data between the memory device 500 and the host 505, such as a serial advanced technology attachment (SATA) interface, a compute express link (CXL), a Fibre Channel interface, a peripheral component interconnect express (PCIe) interface, a universal serial bus (USB) interface, or one or more other physical connectors or interfaces. The host 505 can further utilize an NVM Express (NVMe) interface to access the memory device 500 when the memory device 500 is coupled with the host 505 by the PCIe or CXL interface. The host 505 can include a host system, such as a personal computer, a digital camera, a mobile electronic device, a memory card reader, or one or more other electronic devices external to the memory device 500.

The memory controller 501 can receive instructions from the host 505 and can communicate with the memory array 502, such as to transfer data to (e.g., write or erase) or from (e.g., read) one or more of the memory cells 504 of the memory array 502. The memory controller 501 can include, among other things, circuitry or firmware, such as a number of components or integrated circuits. For example, the memory controller 501 can include one or more memory control units, circuits, or components configured to control access across the memory array 502 and to provide a translation layer between the host 505 and the memory device 500. The memory controller 501 can include one or more input/output (I/O) circuits, lines, or interfaces to transfer data to or from the memory array 502.

The memory array 502 (e.g., a 3D NAND architecture semiconductor memory array) can include a number of memory cells 504 arranged in, for example, a number of devices, planes, blocks, or physical pages. As one example, a memory device 500 can include 18,592 bytes (B) of data per page, 1536 pages per block, 548 blocks per plane, and 4 planes per device. Other examples can include other numbers or arrangements.

In operation, data is typically written to or read from the memory device 500 in pages, and erased in blocks. However, one or more memory operations (e.g., read, write, erase, etc.) can be performed on larger or smaller groups of memory cells, as desired. The data transfer size of a memory device is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells 504 or memory arrays 502 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 6:
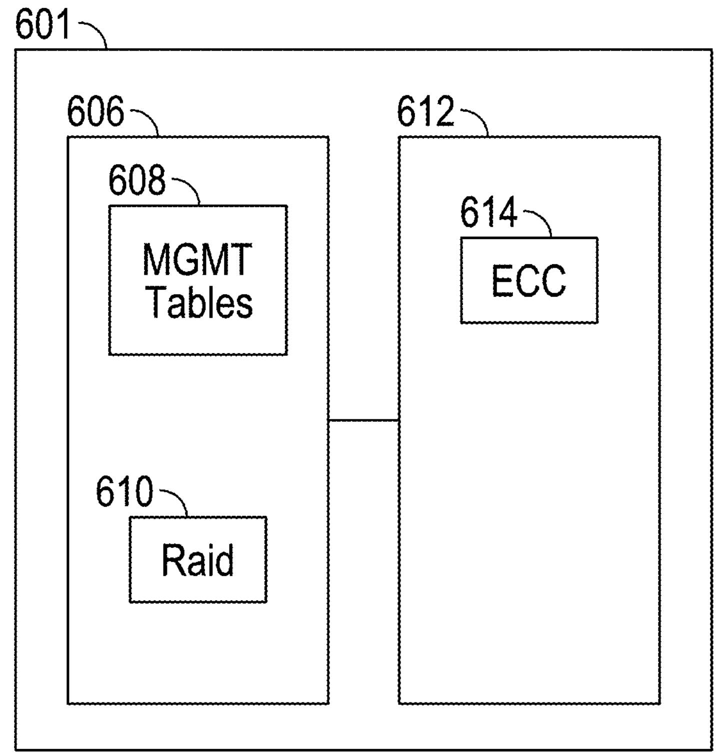
FIG. 6 illustrates an example block diagram of a memory controller.

FIG. 6 illustrates an example block diagram of a memory controller 601 including a memory management component 606 and a memory controller component 612.

The memory management component 606 can include, among other things, circuitry or firmware, such as a number of components or integrated circuits associated with various memory management functions, including wear leveling (e.g., garbage collection or reclamation), error detection or correction, block retirement, or one or more other memory management functions. The memory management component 606 can parse or format host commands (e.g., commands received from a host) into device commands (e.g., commands associated with operation of a memory array, etc.), or generate device commands (e.g., to accomplish various memory management functions) for the memory controller component 612 or one or more other components of a memory device.

The memory management component 606 can include management tables 608 configured to maintain various information associated with one or more component of the memory device (e.g., various information associated with a memory array or one or more memory cells coupled to the memory controller 601). For example, the management tables 608 can include information regarding block age, block erase count, error history, or one or more error counts (e.g., a write operation error count, a read bit error count, a read operation error count, an erase error count, etc.) for one or more blocks of memory cells coupled to the memory controller 601. In certain examples, if the number of detected errors for one or more of the error counts is above a threshold, the bit error can be referred to as an uncorrectable bit error. The management tables 608 can maintain a count of correctable or uncorrectable bit errors, among other things.

The memory management component 606 can include a redundant array of independent disks (RAID) unit 610 (the term "disks" is a carryover from prior implementations using hard disk drives, and does not require that the RAID unit 610 include a physical disk). The RAID unit 610 can provide data reliability through, among other things, redundant memory operations.

The memory controller component 612 can include, among other things, circuitry or components configured to control memory operations associated with writing data to, reading data from, or erasing one or more memory cells of a memory device coupled to the memory controller 601. The memory operations can be based on, for example, host commands received from a host, or internally generated by the memory management component 606 or the memory controller component 612 (e.g., in association with wear leveling, error detection or correction, etc.).

The memory controller component 612 can include an error correction code (ECC) component 614, which can include, among other things, an ECC engine or other circuitry configured to detect or correct errors associated with writing data to or reading data from one or more memory cells of a memory device coupled to the memory controller 601. The memory controller 601 can be configured to actively detect and recover from error occurrences (e.g., bit errors, operation errors, etc.) associated with various operations or storage of data, while maintaining integrity of the data transferred between a host and a memory device, or maintaining integrity of stored data (e.g., using redundant RAID storage in the RAID unit 610, etc.), and can remove (e.g., retire) failing memory resources (e.g., memory cells, memory arrays, pages, blocks, etc.) to prevent future errors.

Figure 7:
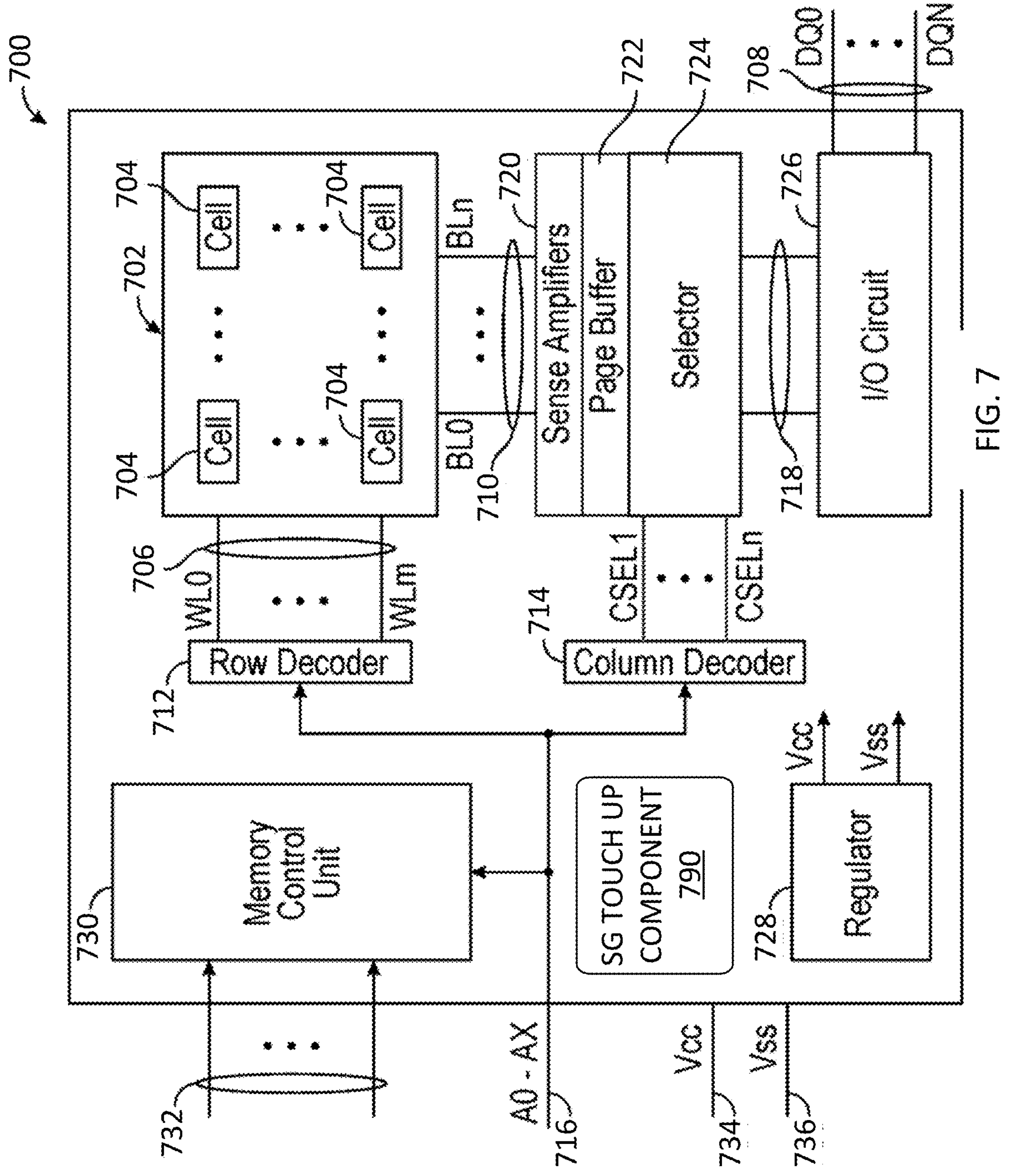
FIG. 7 illustrates an example block diagram of a memory device including an SG touch up component, according to some examples.

FIG. 7 illustrates an example block diagram of a memory device 700 including a memory array 702 having a plurality of memory cells 704, and one or more circuits or components to provide communication with, or perform one or more memory operations on, the memory array 702. The memory device 700 can include a row decoder 712, a column decoder 714, sense amplifiers 720, a page buffer 722, a selector 724, an input/output (I/O) circuit 726, an SG touch up component 790, and a memory control unit 730. In some cases, the SG touch up component 790 can be part of the memory control unit 730 or any other component shown in FIG. 7. The memory cells 704 of the memory array 702 can be arranged in rows, columns, pages, and blocks, and can be accessed using, for example, access lines 706, first data lines 710, or one or more select gates, etc.

The memory control unit 730 can control memory operations of the memory device 700 according to one or more signals or instructions received on control lines 732, including, for example, one or more clock signals or control signals that indicate a desired operation (e.g., write, read, erase, etc.), or address signals (AO-AX) received on an address line 716. One or more devices external to the memory device 700 can control the values of the control signals on the control lines 732, or the address signals on the address line 716. Examples of devices external to the memory device 700 can include, but are not limited to, a host, a memory controller, a processor, or one or more circuits or components not illustrated in FIG. 7.

The memory device 700 can use access lines 706 and first data lines 710 to transfer data to (e.g., write or erase) or from (e.g., read) one or more of the memory cells 704. The row decoder 712 and the column decoder 714 can receive and decode the address signals (AO-AX) from the address line 716, can determine which of the memory cells 704 are to be accessed, and can provide signals to one or more of the access lines 706 (e.g., one or more of a plurality of word lines (WL0-WLm)) or the first data lines 710 (e.g., one or more of a plurality of bit lines (BL0-BLn)), such as described above.

The memory device 700 can include sense circuitry, such as the sense amplifiers 720, configured to determine the values of data on (e.g., read), or to determine the values of data to be written to, the memory cells 704 using the first data lines 710. For example, in a selected string of memory cells, one or more of the sense amplifiers 720 can read a logic level in the selected memory cell in response to a read current flowing in the memory array through the selected string to the data lines 710. In some cases, the read current is compared to a read trim value or level and based on whether the read current exceeds or transgresses the read trim value, the corresponding logic level can be determined.

One or more devices external to the memory device 700 can communicate with the memory device 700 using the I/O lines (DQ0-DQN) 708, address lines 716 (AO-AX), or control lines 732. The input/output (I/O) circuit 726 can transfer values of data in or out of the memory device 700, such as in or out of the page buffer 722 or the memory array 702, using the I/O lines 708, according to, for example, the control lines 732 and address lines 716. The page buffer 722 can store data received from the one or more devices external to the memory device 700 before the data is programmed into relevant portions of the memory array 702, or can store data read from the memory array 702 before the data is transmitted to the one or more devices external to the memory device 700.

The column decoder 714 can receive and decode address signals (AO-AX) into one or more column address signals (CSEL1-CSELn). The selector 724 (e.g., a select circuit) can receive the column select signals and select data in the page buffer 722 representing values of data to be read from or to be programmed into memory cells 704. Selected data can be transferred between the page buffer 722 and the I/O circuit 726 using second data lines 718.

The memory control unit 730 can receive positive and negative supply signals, such as a supply voltage (Vcc) 734 and a negative supply (Vss) 736 (e.g., a ground potential), from an external source or supply (e.g., an internal or external battery, an AC-to-DC converter, etc.). In certain examples, the memory control unit 730 can include a regulator 728 to internally provide positive or negative supply signals.

In some cases, the SG touch up component 790 can be a separate physical component from the components of the memory device 700. In some cases, the SG touch up component 790 and the components of the memory device 700 are implemented by the same physical device or integrated circuit. The SG touch up component 790 can be coupled to the memory control unit 730 (and/or the ECC component 614) to selectively perform SG scan operations and to dynamically compute adjustments to the TU program pulse applied to one or more SGs on a per memory block, per memory die, and/or per memory component/array basis. This way different SGs or groups of SGs can have different TU program pulses applied to ensure that each has a corresponding Vt or Vt distribution that falls within a specified operating range.

Depending on the example, the SG touch up component 790 can comprise logic (e.g., a set of transitory or non-transitory machine instructions, such as firmware) or one or more components that causes the SG touch up component 790 to perform operations described herein. The SG touch up component 790 can comprise a tangible or non-tangible unit capable of performing operations described herein.

The SG touch up component 790 can selectively and intelligently adjust the TU program pulse that is applied to different SGs of the memory sub-system (e.g., memory device 100). Particularly, the SG touch up component 790 can determine that a condition is satisfied for performing an SG scan and/or for applying a touch up (TU) program pulse to one or more SGs. The condition can be satisfied when a threshold voltage (Vt) distribution of a set of SGs is close or within a threshold distance or amount to a lower or upper bound of a specified operating range for the Vt (e.g., prior to reaching a high temperature threshold) and/or when a temperature is above the high temperature threshold and is unlikely to drop below the high temperature threshold within a threshold time interval. In such cases or periodically, the SG touch up component 790 can obtain data associated with memory cells coupled to one or more SGs. The SG touch up component 790 can then dynamically compute or retrieve a TU program pulse value based on the obtained data. This way, different TU program pulse adjustments can be performed for SGs associated with different memory blocks and/or memory dies which reduces errors in data stored by the memory sub-system. This improves the overall efficiency of operating and implementing the memory sub-system. This innovative approach enables the NAND system to gather and analyze the in-field Vt distribution of SG cells using SG Vt scans. By combing this data with the temperature information, the system dynamically adjusts the trim values in the TU program pulse, ensuring precise placement of SG Vts within the desired range. This improves the overall efficiency of operating and implementing the memory sub-system.

Figure 8:
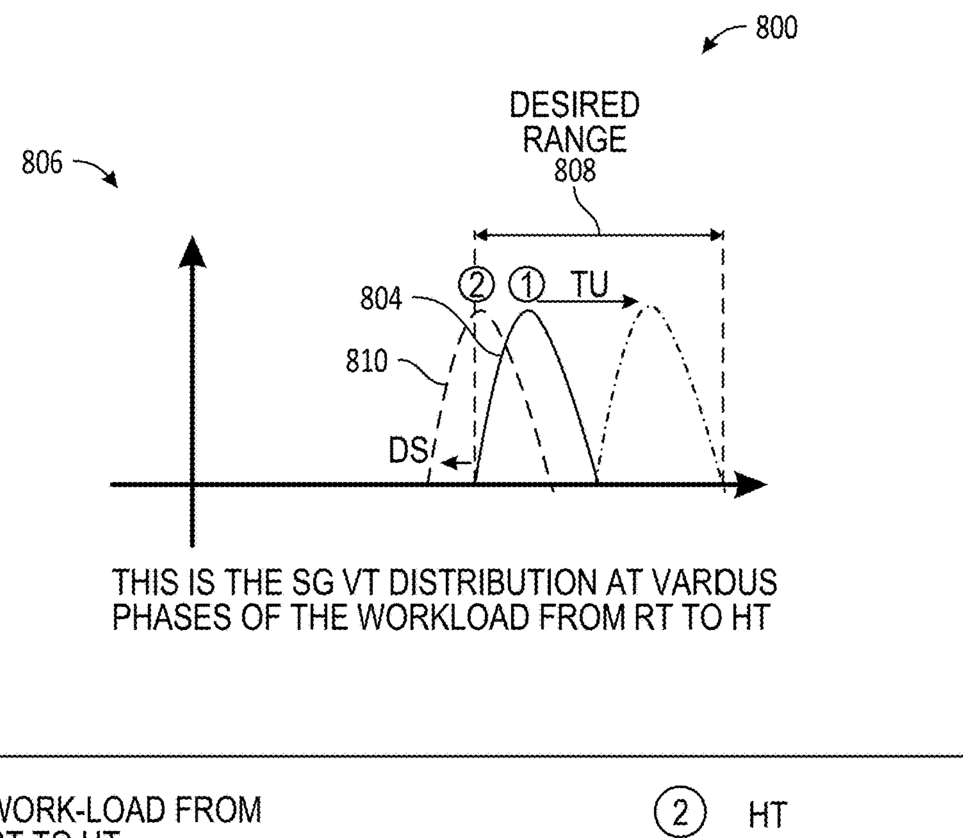
FIG. 8 illustrates a condition for performing TU adjustments, according to some examples.

FIG. 8 illustrates a condition 800 for performing TU adjustments, according to some examples. For example, in some cases, the SG touch up component 790 determines that a condition for initiating SG scan operations includes a periodic or scheduled interval. Namely, the SG touch up component 790 can perform the SG scan operations at predefined periods. In some cases, as shown in FIG. 8, the SG touch up component 790 determines the condition for performing the SG scan operations is satisfied or met based on temperature conditions of the memory device 100.

For example, the SG touch up component 790 can determine that, as shown in the diagram 802, a current temperature of the memory device 100 corresponds to room temperature (RT) or some other temperature that is below a high temperature threshold. At this time, the SG touch up component 790 can access or compute a Vt distribution of a set of SGs. Specifically, the SG touch up component 790 can determine a Vt distribution 804 of the set of SGs, as shown in diagram 806. The SG touch up component 790 can determine that a portion of the Vt distribution is within a threshold proximity of a lower bound of a specified operating range 808 of the Vt distribution. In such cases, the SG touch up component 790 can predict that when the temperature of the memory device 100 reaches a high temperature threshold, the Vt distribution of the set of SGs will shift to become a different Vt distribution 810. The shifted Vt distribution 810 would fall outside of the specified operating range 808 when the temperature of the memory device 100 reaches the high temperature threshold. At that point, performing SG scan operations to correct the Vt distribution may not be feasible or would result in errors.

In such circumstances, the SG touch up component 790 can determine that the condition for performing the SG scan operations is met when the Vt distribution 804 is close or within a threshold proximity of the lower bound of the specified operating range 808. At this point, prior to the memory device 500 reaching the high temperature threshold, the SG touch up component 790 can initiate the SG scan operations to apply a TU program pulse to the set of SGs to move the Vt distribution of the set of SGs to another region of the specified operating range 808. This way, when the memory device 500 ultimately reaches a high temperature threshold, the Vt distribution may not fall outside of the specified operating range 808.

Figure 9:
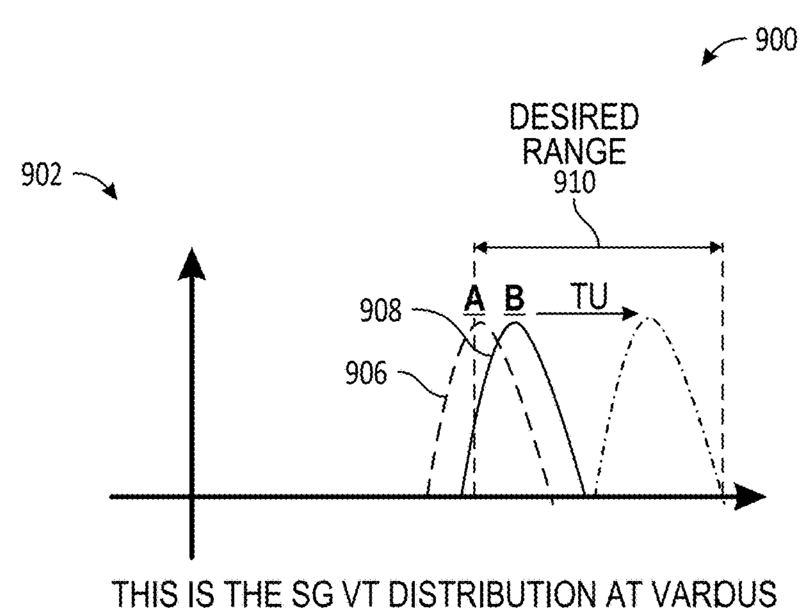
FIG. 9 illustrates a condition for performing TU adjustments, according to some examples.

FIG. 9 illustrates a condition 900 for performing TU adjustments, according to some examples. Specifically, the SG touch up component 790 can determine that the current temperature of the memory device 500 is above a high temperature threshold 912, as shown in diagram 904.

In such cases, the SG touch up component 790 can obtain a first Vt distribution 906 of a first set of SGs. The SG touch up component 790 can compare the first Vt distribution 906 to a specified Vt distribution 910 of the memory device 500. The SG touch up component 790 can determine that the first Vt distribution 906 falls outside of the specified Vt distribution 910 by more than a threshold amount. In such cases, the SG touch up component 790 can determine that the condition for performing SG scan operations is satisfied and can initiate the SG scan operations to apply a TU program pulse to the first set of SGs to move the first Vt distribution 906 of the first set of SGs to another region of the specified Vt distribution 910 while the memory device 500 operates in the high temperature threshold 912 and prior to entering a room temperature 914 (e.g., operating temperature that is below the high temperature threshold 912).

As another example, the SG touch up component 790 can compute, as shown in the diagram 902, a second Vt distribution 908 of a second set of SGs. In such cases, the SG touch up component 790 can determine that a portion of the second Vt distribution 908 is within a threshold proximity of a lower bound of a specified Vt distribution 910 (e.g., the normal operating range of the SGs). In response, the SG touch up component 790 can selectively skip, delay, or prevent performing SG scan operations (e.g., selectively apply a TU program pulse) on the second set of SGs based on another criterion or criteria (e.g., based on a prediction of when the memory device 500 will transition to operating in a room temperature 914 or temperature that is below the high temperature threshold).

For example, in response to the SG touch up component 790 determining that the second Vt distribution 908 of the second set of SGs is within a threshold distance or amount to a lower bound of the specified Vt distribution 910, the SG touch up component 790 can access a temperature sensor of the memory device 500. The SG touch up component 790 can determine a current temperature (e.g., a first temperature) of a portion of the memory device 500 based on the reading from the temperature sensor. The SG touch up component 790 can initialize a timer and can set a threshold value for the timer (e.g., 4 hours). The SG touch up component 790 can determine that the timer has reached the threshold value and, at that point, the SG touch up component 790 can again read the temperature (e.g., a second temperature) from the temperature sensor of the portion of the memory device 500. The SG touch up component 790 can determine whether the most recently read temperature is less than the previously read temperature (e.g., the first temperature). The SG touch up component 790 can determine whether the second temperature is less than the first temperature by more than a threshold amount (e.g., more than 5 degrees). In such cases, the SG touch up component 790 determines or predicts that the memory device 500 is going to enter the room temperature 914 state soon and prevents, skips, or delays performing the SG scan operations on the second set of SGs.

In some cases, the SG touch up component 790 can determine that the second temperature is not less than the first temperature by more than the threshold amount (e.g., more than 5 degrees). In such cases, the SG touch up component 790 determines or predicts that the memory device 500 is not going to enter the room temperature 914 state soon. In response, the SG touch up component 790 can determine that the condition for performing SG scan operations is satisfied and can initiate the SG scan operations to apply a TU program pulse to the second set of SGs to move the second Vt distribution 908 of the second set of SGs to another region of the specified Vt distribution 910 while the memory device 500 continues to operate in the high temperature threshold 912 and prior to entering the room temperature 914 (e.g., operating temperature that is below the high temperature threshold 912).

Figure 10:
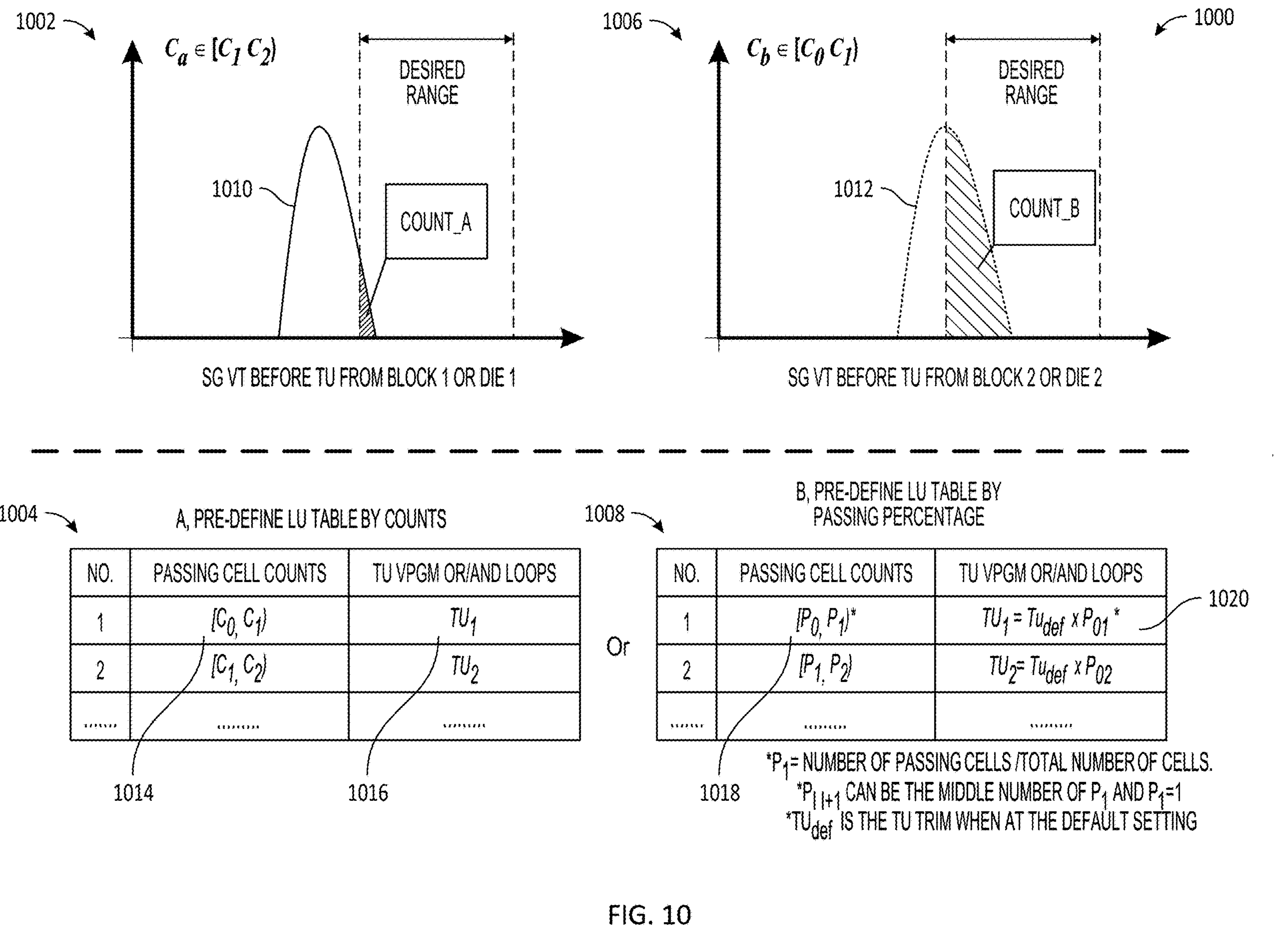
FIG. 10 illustrates data collected for performing TU adjustments, according to some examples.
Figure 11:
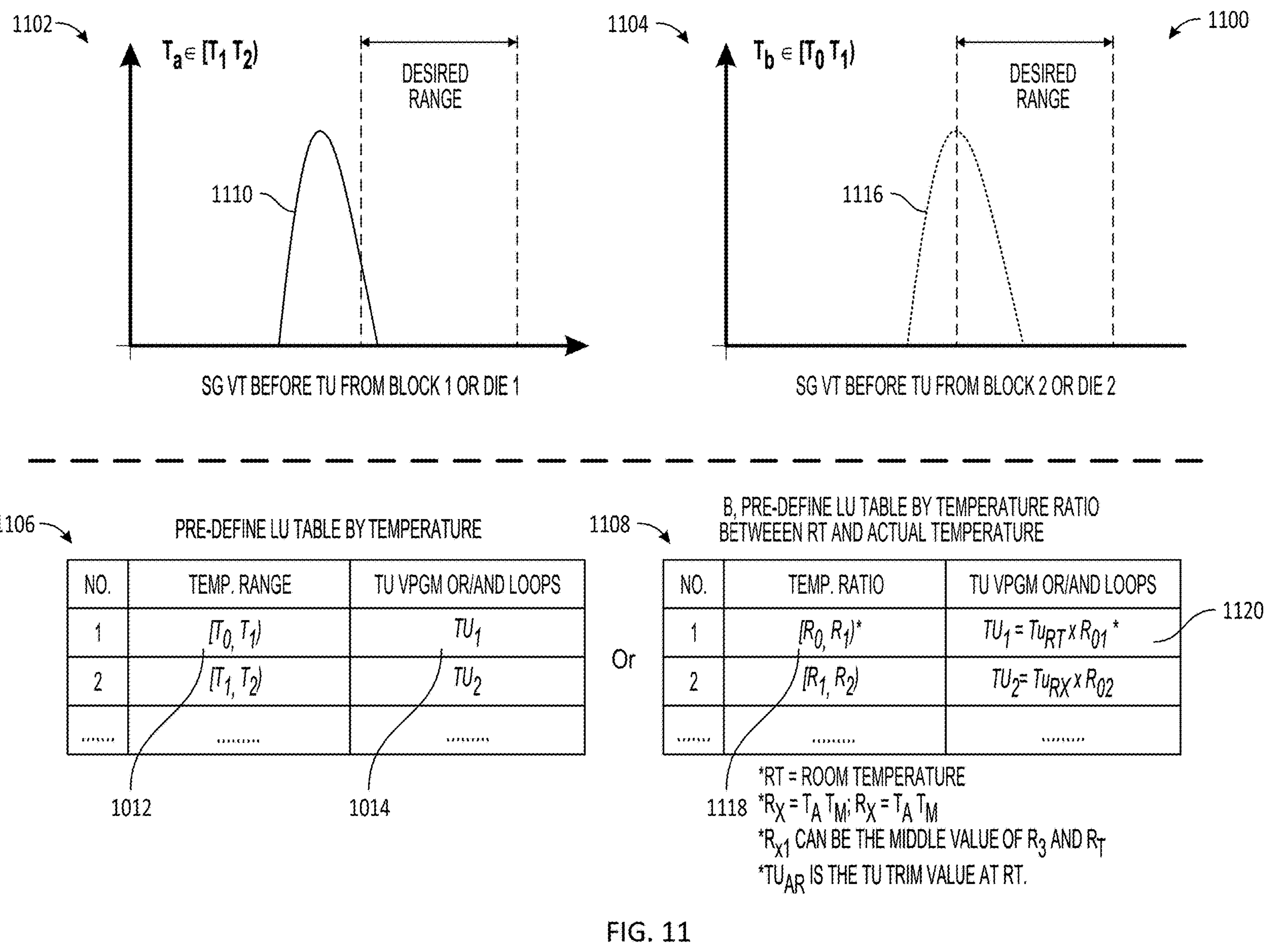
FIG. 11 illustrates data collected for performing TU adjustments, according to some examples.
Figure 12:
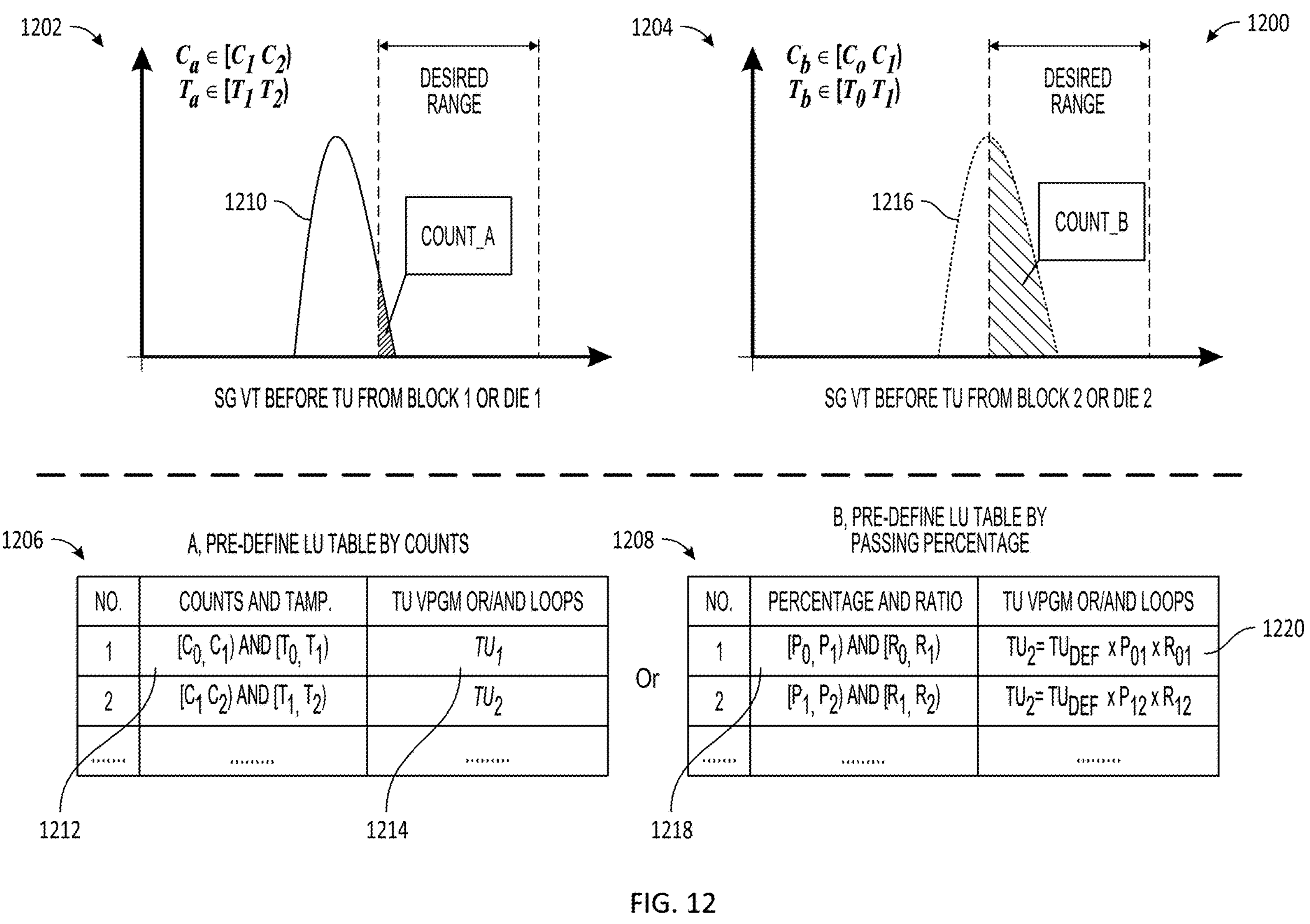
FIG. 12 illustrates data collected for performing TU adjustments, according to some examples.

FIG. 10 illustrates a diagram 1000 of data collected for performing TU adjustments, according to some examples. Particularly, FIGS. 10-12 illustrate different ways in which the SG touch up component 790 can apply a TU program pulse to a set of SGs during an SG scan operation. Specifically, as shown in FIG. 10, the SG touch up component 790 can select an individual SG or set of SGs during an SG scan operation. As shown in diagram 1002, the SG touch up component 790 can compute a count value 1010 of memory cells associated with the selected SG or set of SGs by reading data from the memory cells coupled to the selected SG or set of SGs. Specifically, the SG touch up component 790 can read data from the memory cells and compute how many of the memory cells pass the SG scan operation.

The SG touch up component 790 can access a table 1004 that associates different ranges of cell counts that pass the SG scan operation with different TU program trims or loops. For example, the table 1004 can associate a first range of cell counts 1014 with a first TU adjustment 1016. The table 1004 can similarly associate a second range of cell counts with a second TU adjustment. The SG touch up component 790 can determine that the quantity of memory cells associated with the selected SG or set of SGs that pass the SG scan falls within the first range of cell counts 1014. In response, the SG touch up component 790 retrieves the first TU adjustment 1016. The SG touch up component 790 modifies the TU program pulse or computes the TU program pulse based on the first TU adjustment 1016 and applies the modified or adjusted TU program pulse to the selected SG or set of SGs to shift the Vt distribution of the selected SG or set of SGs to a specified operating range (e.g., the desired range shown in diagram 1002).

In some cases, the SG touch up component 790 can use passing cell percentage rather than the actual measured quantity of passing cells to retrieve the TU program pulse adjustment. For example, the SG touch up component 790 can select a second SG or set of SGs during an SG scan operation. As shown in diagram 1006, the SG touch up component 790 can compute a count value 1012 of memory cells associated with the selected second SG or set of SGs by reading data from the memory cells coupled to the selected second SG or set of SGs. Specifically, the SG touch up component 790 can read data from the memory cells and compute how many of the memory cells pass the SG scan operation. The SG touch up component 790 can determine how many total memory cells are coupled or associated with the second SG or set of SGs. The SG touch up component 790 can then compute a percentage by dividing the number of memory cells that pass the SG scan operation by the total number of memory cells.

The SG touch up component 790 can access a table 1008 that associates different ranges of passing cell percentages that pass the SG scan operation with different TU program trims or loops. For example, the table 1008 can associate a first range of cell percentages 1018 with a third TU adjustment 1020. The table 1004 can similarly associate a second range of cell percentages with a fourth TU adjustment. The third TU adjustment 1020 can be defined by multiplying a middle value (or any other suitable number within the range) of the first range of cell percentages 1018 by a predefined TU trim value. Similarly, the fourth TU adjustment can be defined by multiplying a middle value (or any other suitable number within the range) of the second range of cell percentages by the predefined TU trim value.

The SG touch up component 790 can determine that the computed percentage of memory cells associated with the selected second SG or set of SGs that pass the SG scan falls within the first range of cell percentages 1018. In response, the SG touch up component 790 retrieves the third TU adjustment 1020. The SG touch up component 790 modifies the TU program pulse or computes the TU program pulse based on the third TU adjustment 1020 and applies the modified or adjusted TU program pulse to the selected second SG or set of SGs to shift the Vt distribution of the selected second SG or set of SGs to a specified operating range (e.g., the desired range shown in diagram 1006).

The selected second SG or set of SGs can be used to control a second memory block or second memory die that differs from the other selected SG or set of SGs corresponding to the count value 1010. This way, different TU adjustments can be made by the SG touch up component 790 for different memory portions.

As shown in the diagram 1100 of FIG. 11, the SG touch up component 790 can select an individual SG or set of SGs during an SG scan operation. As shown in diagram 1102, the SG touch up component 790 can compute a current temperature 1110 of memory cells associated with the selected SG or set of SGs by reading a temperature sensor of a memory portion that includes the memory cells coupled to the selected SG or set of SGs.

The SG touch up component 790 can access a table 1106 that associates different ranges of temperatures with different TU program trims or loops. For example, the table 1106 can associate a first temperature range 1112 with a first TU adjustment 1114. The table 1004 can similarly associate a second temperature range with a second TU adjustment. The SG touch up component 790 can determine that the current temperature 1110 associated with the selected SG or set of SGs falls within the first temperature range 1112. In response, the SG touch up component 790 retrieves the first TU adjustment 1114. The SG touch up component 790 modifies the TU program pulse or computes the TU program pulse based on the first TU adjustment 1114 and applies the modified or adjusted TU program pulse to the selected SG or set of SGs to shift the Vt distribution of the selected SG or set of SGs to a specified operating range (e.g., the desired range shown in diagram 1102).

In some cases, the SG touch up component 790 can use ratio of the current temperature to ambient/room/threshold temperature rather than the actual measured current temperature to retrieve the TU program pulse adjustment. For example, the SG touch up component 790 can select a second SG or set of SGs during an SG scan operation. As shown in diagram 1104, the SG touch up component 790 can compute a current temperature 1116 of memory cells associated with the selected second SG or set of SGs by reading the temperature sensor of the memory cells coupled to the selected second SG or set of SGs. The SG touch up component 790 can then compute a ratio of the current temperature 1116 to the ambient/room/threshold temperature.

The SG touch up component 790 can access a table 1108 that associates different ranges of temperature ratios with different TU program trims or loops. For example, the table 1108 can associate a first temperature ratio range 1118 with a third TU adjustment 1120. The table 1004 can similarly associate a second temperature ratio with a fourth TU adjustment. The third TU adjustment 1120 can be defined by multiplying a middle value (or any other suitable number within the range) of the first temperature ratio range 1118 by a predefined TU trim value. Similarly, the fourth TU adjustment can be defined by multiplying a middle value (or any other suitable number within the range) of the second temperature ratio range by the predefined TU trim value.

The SG touch up component 790 can determine that the computed ratio of the current temperature to the ambient/room/threshold temperature of the memory cells associated with the selected second SG or set of SGs that pass the SG scan falls within the first range of cell percentages first temperature ratio range 1118. In response, the SG touch up component 790 retrieves the third TU adjustment 1120. The SG touch up component 790 modifies the TU program pulse or computes the TU program pulse based on the third TU adjustment 1120 and applies the modified or adjusted TU program pulse to the selected second SG or set of SGs to shift the Vt distribution of the selected second SG or set of SGs to a specified operating range (e.g., the desired range shown in diagram 1104).

The selected second SG or set of SGs can be used to control a second memory block or second memory die that differs from the other selected SG or set of SGs corresponding to the current temperature 1110. This way, different TU adjustments can be made by the SG touch up component 790 for different memory portions.

As shown in the diagram 1200 of FIG. 12, the SG touch up component 790 can select an individual SG or set of SGs during an SG scan operation. As shown in diagram 1202, the SG touch up component 790 can compute a first data set 1210 (number of bits/cells that pass the SG scan and current temperature) of memory cells associated with the selected SG or set of SGs, such as by reading a temperature sensor of a memory portion that includes the memory cells coupled to the selected SG or set of SGs and reading data from the memory cells.

The SG touch up component 790 can access a table 1206 that associates different ranges of combinations of data (e.g., ranges of bits that pass the SG scan and temperature range) with different TU program trims or loops. For example, the table 1206 can associate a first combination of data range 1212 with a first TU adjustment 1214. The table 1004 can similarly associate a second combination of data with a second TU adjustment. The SG touch up component 790 can determine that the first data set 1210 associated with the selected SG or set of SGs falls within the first combination of data range 1212. In response, the SG touch up component 790 retrieves the first TU adjustment 1214. The SG touch up component 790 modifies the TU program pulse or computes the TU program pulse based on the first TU adjustment 1214 and applies the modified or adjusted TU program pulse to the selected SG or set of SGs to shift the Vt distribution of the selected SG or set of SGs to a specified operating range (e.g., the desired range shown in diagram 1202). For example, the first combination of data range 1212 can include a first range of number of cells that pass the SG scan and a first range of temperatures of the memory device 500. The SG touch up component 790 can determine that the number of memory cells/bits that pass the SG scan fall within the first range of number of cells and that the current temperature falls within the first range of temperatures. In these cases, the SG touch up component 790 retrieves the corresponding first TU adjustment 1214 to adjust the TU program pulse that is applied to the SGs associated with the memory cells.

In some cases, the SG touch up component 790 can use ratio of the current temperature to ambient/room/threshold temperature rather than the actual measured current temperature in combination with percentage of number of bits to total number of bits that pass the SG scan to retrieve the TU program pulse adjustment. For example, the SG touch up component 790 can select a second SG or set of SGs during an SG scan operation. As shown in diagram 1204, the SG touch up component 790 can compute a second data set 1216 of memory cells associated with the selected second SG or set of SGs by reading the temperature sensor of the memory cells coupled to the selected second SG or set of SGs and by reading data to compute how many cells/bits pass the SG scan. The SG touch up component 790 can then compute a ratio of the current temperature 1116 to the ambient/room/threshold temperature and can compute the percentage by dividing the number of bits/cells that pass the SG scan to the total number of cells/bits associated with the second SG or set of SGs.

The SG touch up component 790 can access a table 1208 that associates different combinations of ranges of temperature ratios and percentages with different TU program trims or loops. For example, the table 1208 can associate a second combination of data range 1218 with a third TU adjustment 1220. The table 1004 can similarly associate a third combination of data range with a fourth TU adjustment. The third TU adjustment 1220 can be defined by multiplying a middle value (or any other suitable number within the range) of the temperature range of the 1218 by the middle value (or any other suitable number within the range) of the range of percentages of memory cells/bits that pass the SG scan in the second combination of data range 1218 and by a predefined TU trim value. Similarly, the fourth TU adjustment can be defined by multiplying middle values (or any other suitable number within the range) of each range in the third combination of data range by the predefined TU trim value.

The SG touch up component 790 can determine that the computed second data set 1216 falls within the second combination of data range 1218. In response, the SG touch up component 790 retrieves the third TU adjustment 1220. The SG touch up component 790 modifies the TU program pulse or computes the TU program pulse based on the third TU adjustment 1220 and applies the modified or adjusted TU program pulse to the selected second SG or set of SGs to shift the Vt distribution of the selected second SG or set of SGs to a specified operating range (e.g., the desired range shown in diagram 1204).

FIG. 13 is a flow diagram of an example method (or process) 1300 to perform empty page scan operations, in accordance with some examples. Method 1300 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some examples, the method 1300 is performed by the memory sub-system controller 501 or subcomponents of the memory controller 501 of FIG. 5. In these examples, the method 1300 can be performed, at least in part, by the SG touch up component 790. Although the processes are shown in a particular sequence or order, unless otherwise specified, the order of the processes can be modified. Thus, the illustrated examples should be understood only as examples; the illustrated processes can be performed in a different order, and some processes can be performed in parallel. Additionally, one or more processes can be omitted in various examples. Thus, not all processes are required in every example. Other process flows are possible.

Referring now to FIG. 13, the method (or process) 1300 begin at operation 1302, with the SG touch up component 790 of a memory sub-system (e.g., memory device 100) detecting a condition for performing a select gate (SG) scan for a set of SGs associated with a set of memory components (e.g., memory cells 228) of a memory sub-system. The SG touch up component 790, in response to detecting the condition for performing the SG scan, at operation 1304, accesses data associated with a plurality of memory cells of the set of memory components coupled to an individual SG of the set of SGs. Then, at operation 1306, the SG touch up component 790 adjusts a touch up (TU) program pulse based on the accessed data associated with the plurality of memory cells and, at operation 1308, applies the adjusted TU program pulse to the individual SG to place a threshold voltage (Vt) of the individual SG within a specified operating range.

Figure 14:
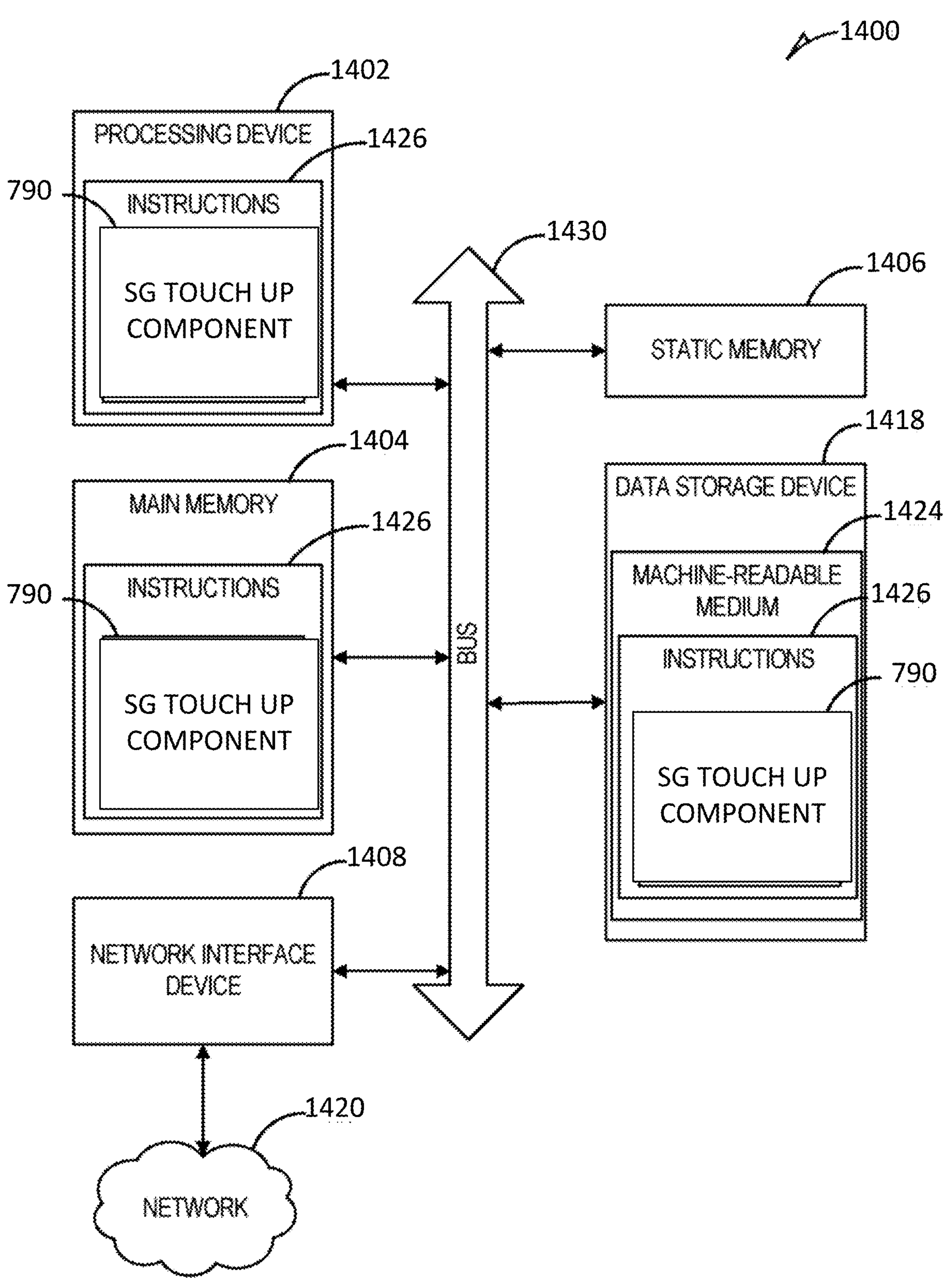
FIG. 14 is a block diagram illustrating a diagrammatic representation of a machine in the form of a computer system within which a set of instructions can be executed for causing the machine to perform any one or more of the methodologies discussed herein, in accordance with some examples of the present disclosure.

FIG. 14 illustrates an example machine in the form of a computer system 1400 within which a set of instructions can be executed for causing the machine to perform any one or more of the methodologies discussed herein. In some examples, the computer system 1400 can correspond to a host system (e.g., the host 505 of FIG. 5) that includes, is coupled to, or utilizes a memory sub-system (e.g., the 3D NAND architecture semiconductor memory device 100 of FIG. 1) or can be used to perform the operations of a controller (e.g., to execute an operating system to perform operations corresponding to the SG touch up component 790 of FIG. 7). In alternative examples, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1400 includes a processing device 1402, a main memory 1404 (e.g., read-only memory (ROM), flash memory, dynamic random access memory (DRAM) such as synchronous DRAM (SDRAM) or Rambus DRAM (RDRAM), etc.), a static memory 1406 (e.g., flash memory, static random access memory (SRAM), etc.), and a data storage system 1418, which communicate with each other via a bus 1430.

The processing device 1402 represents one or more general-purpose processing devices such as a microprocessor, a central processing unit, or the like. More particularly, the processing device 1402 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 1402 can also be one or more special-purpose processing devices such as an application specific integrated circuit (ASIC), a field programmable gate array (FPGA), a digital signal processor (DSP), a network processor, or the like. The processing device 1402 is configured to execute instructions 1426 for performing the operations and steps discussed herein. The computer system 1400 can further include a network interface device 1408 to communicate over a network 1420.

The data storage system 1418 can include a machine-readable storage medium 1424 (also known as a computer-readable medium) on which is stored one or more sets of instructions 1426 or software embodying any one or more of the methodologies or functions described herein. The instructions 1426 can also reside, completely or at least partially, within the main memory 1404 and/or within the processing device 1402 during execution thereof by the computer system 1400, the main memory 1404 and the processing device 1402 also constituting machine-readable storage media. The machine-readable storage medium 1424, data storage system 1418, and/or main memory 1404 can correspond to the 3D NAND architecture semiconductor memory device 100 of FIG. 1.

In one example, the instructions 1426 implement functionality corresponding to the SG touch up component 790. While the machine-readable storage medium 1424 is shown in an example to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

EXAMPLES

Example 1: An apparatus comprising: a memory sub-system comprising a set of memory components; and a processing device coupled to the set of memory components and configured to perform operations comprising: detecting a condition for performing a select gate (SG) scan for a set of SGs associated with the set of memory components; in response to detecting the condition for performing the SG scan, accessing data associated with a plurality of memory cells of the set of memory components coupled to an individual SG of the set of SGs; adjusting a touch up (TU) program pulse based on the accessed data associated with the plurality of memory cells; and applying the adjusted TU program pulse to the individual SG to place a threshold voltage (Vt) of the individual SG within a specified operating range.

Example 2. The apparatus of Example 1, wherein the specified operating range comprises a lower bound and an upper bound, the operations comprising: obtaining the Vt of the individual SG that was determined when a temperature of the memory sub-system was below a high temperature threshold; determining that the obtained Vt is less than a threshold amount from the lower bound of the specified operating range; and in response to determining that the obtained Vt is less than the threshold amount from the lower bound of the specified operating range, determining that the condition for performing the SG scan is satisfied.

Example 3. The apparatus of Example 2, the operations comprising: adjusting the TU program pulse before the temperature of the memory sub-system reaches the high temperature threshold.

Example 4. The apparatus of Example 3, the operations comprising: selecting between performing a soft TU program pulse adjustment and strong TU program pulse adjustment based on a Vt distribution of the individual SG while the temperature of the memory sub-system is below the high temperature threshold.

Example 5. The apparatus of any one of Examples 1-4, the operations comprising: selectively adjusting the TU program pulse while a temperature of the memory sub-system is above a high temperature threshold.

Example 6. The apparatus of Example 5, the operations comprising: determining a Vt distribution of the individual SG while the temperature of the memory sub-system is above the high temperature threshold; in response to determining that more than a threshold amount of the Vt distribution of the individual SG is outside of the specified operating range, determining that the condition is satisfied for adjusting the TU program pulse while the temperature of the memory sub-system is above the high temperature threshold.

Example 7. The apparatus of any one of Examples 5-6, the operations comprising: determining a Vt distribution of the individual SG while the temperature of the memory sub-system is above the high temperature threshold; and in response to determining that less than a threshold amount of the Vt distribution of the individual SG is outside of the specified operating range, selectively delaying adjusting the TU program pulse while the temperature of the memory sub-system is above the high temperature threshold.

Example 8. The apparatus of Example 7, the operations comprising: determining whether the temperature of the memory sub-system that is above the high temperature threshold will be below the high temperature threshold within a threshold period of time.

Example 9. The operations of Example 8, the operations comprising: in response to determining that the temperature of the memory sub-system is above the high temperature threshold and will be below the high temperature threshold within the threshold period of time, delaying adjusting the TU program pulse until the temperature of the memory sub-system is below the high temperature threshold.

Example 10. The apparatus of any one of Examples 8-9, the operations comprising: in response to determining that the temperature of the memory sub-system is above the high temperature threshold and will not be below the high temperature threshold within the threshold period of time, adjusting the TU program pulse without delaying.

Example 11. The apparatus of any one of Example 8-10, the operations comprising: obtaining a first temperature corresponding to a current temperature of a portion of the memory sub-system from a temperature sensor; initializing a timer; determining that the timer has reached a threshold value; in response to determining that the timer has reached the threshold value, obtaining a second temperature corresponding to the current temperature of the portion of the memory sub-system from the temperature sensor; comparing the first temperature with the second temperature; determining that the second temperature is lower than the first temperature by more than a threshold amount; and in response to determining that the second temperature is lower than the first temperature by more than the threshold amount, determining that the temperature of the memory sub-system that is above the high temperature threshold will be below the high temperature threshold within the threshold period of time.

Example 12. The apparatus of any one of Examples 1-11, the operations for accessing data comprising: reading data from the plurality of memory cells coupled to the individual SG prior to adjusting the TU program pulse; and determining a quantity of cell bits of the plurality of memory cells that pass the SG scan based on reading the data.

Example 13. The apparatus of Example 12, the operations comprising: accessing a table that associates different ranges of cell bits that pass the SG scan with respective TU program pulse adjustment values; determining that the quantity of cell bits that pass the SG scan correspond to a first range of cell bits in the table; obtaining a TU program pulse adjustment value associated with the first range; and adjusting the TU program pulse that is applied to the individual SG based on the obtained TU program pulse adjustment.

Example 14. The apparatus of any one of Examples 12-13, wherein the quantity of cell bits is computed as a total count or as a percentage of a total number of cells in the plurality of memory cells, and wherein different TU program pulse adjustments are applied to different SGs of the set of SGs corresponding to different memory blocks or memory dies.

Example 15. The apparatus of any one of Examples 1-14, the operations for accessing data comprising: reading a temperature associated with the individual SG prior to adjusting the TU program pulse; and adjusting the TU program pulse based on the temperature.

Example 16. The apparatus of Example 15, the operations comprising: accessing a table that associates different ranges of temperatures with respective TU program pulse adjustment values; determining that the temperature associated with the individual SG corresponds to a first range of cell bits in the table; obtaining a TU program pulse adjustment value associated with the first range; and adjusting the TU program pulse that is applied to the individual SG based on the obtained TU program pulse adjustment.

Example 17. The apparatus of Example 16, wherein the temperature is computed as an actual value read from a temperature sensor or as a ratio of the actual value read to a threshold temperature value, wherein the memory sub-system comprises three-dimensional (3D) NAND memory structures and replacement-gate (RG) NAND devices.

Example 18. The apparatus of any one of Examples 1-17, the operations for accessing data comprising: reading data from the plurality of memory cells coupled to the individual SG prior to adjusting the TU program pulse; determining a quantity of cell bits of the plurality of memory cells that pass the SG scan based on reading the data; reading a temperature associated with the individual SG prior to adjusting the TU program pulse; accessing a table that associates different ranges of temperatures and different ranges of cell bits that pass the SG scan with respective TU program pulse adjustment values; obtaining a TU program pulse adjustment value associated with an individual range in the table based on the read temperature and the determined quantity of cell bits; and adjusting the TU program pulse that is applied to the individual SG based on the obtained TU program pulse adjustment.

Example 19. A method comprising: detecting a condition for performing a select gate (SG) scan for a set of SGs associated with a set of memory components of a memory sub-system; in response to detecting the condition for performing the SG scan, accessing data associated with a plurality of memory cells of the set of memory components coupled to an individual SG of the set of SGs; adjusting a touch up (TU) program pulse based on the accessed data associated with the plurality of memory cells; and applying the adjusted TU program pulse to the individual SG to place a threshold voltage (Vt) of the individual SG within a specified operating range.

Example 20. A non-transitory computer-readable storage medium comprising instructions that, when executed by a processing device, cause the processing device to perform operations comprising: detecting a condition for performing a select gate (SG) scan for a set of SGs associated with a set of memory components of a memory sub-system; in response to detecting the condition for performing the SG scan, accessing data associated with a plurality of memory cells of the set of memory components coupled to an individual SG of the set of SGs; adjusting a touch up (TU) program pulse based on the accessed data associated with the plurality of memory cells; and applying the adjusted TU program pulse to the individual SG to place a threshold voltage (Vt) of the individual SG within a specified operating range.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some examples, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

The above detailed description includes references to the accompanying drawings, which form a part of the detailed description. The drawings show, by way of illustration, specific examples in which the inventive subject matter can be practiced. These examples are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes-but is not limited to-direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends linearly relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various examples is defined only by the appended claims, along with the full scope of equivalents to which such claims are entitled.

Various examples according to the present disclosure and described herein include memory utilizing a vertical structure of memory cells (e.g., NAND strings of memory cells). As used herein, directional adjectives will be taken relative a surface of a substrate upon which the memory cells are formed (e.g., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some examples described herein, different doping configurations may be applied to a select gate source (SGS), a control gate (CG), and a select gate drain (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, sensing charge distribution, writing to, or erasing the memory cell. The operation of placing a memory cell in an intended state is referred to herein as "programming," and can include both writing to or erasing from the memory cell (e.g., the memory cell may be programmed to an erased state).

According to one or more examples of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more examples of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other examples can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed example. Thus, the following claims are hereby incorporated into the Detailed Description, with each claim standing on its own as a separate example, and it is contemplated that such examples can be combined with each other in various combinations or permutations. The scope of the inventive subject matter should be determined with reference to the appended claims, along with the full scope of equivalents to which such claims are entitled.

The invention claimed is:

1. An apparatus comprising:

a memory sub-system comprising a set of memory components; and a processing device coupled to the set of memory components and configured to perform operations comprising:

detecting a condition for performing a select gate (SG) scan for a set of SGs associated with the set of memory components;

in response to detecting the condition for performing the SG scan, accessing data associated with a plurality of memory cells of the set of memory components coupled to an individual SG of the set of SGs;

adjusting a touch up (TU) program pulse based on the accessed data associated with the plurality of memory cells; and applying the adjusted TU program pulse to the individual SG to place a threshold voltage (Vt) of the individual SG within a specified operating range.

2. The apparatus of claim 1, wherein the specified operating range comprises a lower bound and an upper bound, the operations comprising:

obtaining the Vt of the individual SG that was determined when a temperature of the memory sub-system was below a high temperature threshold;

determining that the obtained Vt is less than a threshold amount from the lower bound of the specified operating range; and in response to determining that the obtained Vt is less than the threshold amount from the lower bound of the specified operating range, determining that the condition for performing the SG scan is satisfied.

3. The apparatus of claim 2, the operations comprising:

adjusting the TU program pulse before the temperature of the memory sub-system reaches the high temperature threshold.

4. The apparatus of claim 3, the operations comprising:

selecting between performing a soft TU program pulse adjustment and strong TU program pulse adjustment based on a Vt distribution of the individual SG while the temperature of the memory sub-system is below the high temperature threshold.

5. The apparatus of claim 1, the operations comprising:

selectively adjusting the TU program pulse while a temperature of the memory sub-system is above a high temperature threshold.

6. The apparatus of claim 5, the operations comprising:

determining a Vt distribution of the individual SG while the temperature of the memory sub-system is above the high temperature threshold;

in response to determining that more than a threshold amount of the Vt distribution of the individual SG is outside of the specified operating range, determining that the condition is satisfied for adjusting the TU program pulse while the temperature of the memory sub-system is above the high temperature threshold.

7. The apparatus of claim 5, the operations comprising:

determining a Vt distribution of the individual SG while the temperature of the memory sub-system is above the high temperature threshold; and in response to determining that less than a threshold amount of the Vt distribution of the individual SG is outside of the specified operating range, selectively delaying adjusting the TU program pulse while the temperature of the memory sub-system is above the high temperature threshold.

8. The apparatus of claim 7, the operations comprising:

determining whether the temperature of the memory sub-system that is above the high temperature threshold will be below the high temperature threshold within a threshold period of time.

9. The apparatus of claim 8, the operations comprising:

in response to determining that the temperature of the memory sub-system is above the high temperature threshold and will be below the high temperature threshold within the threshold period of time, delaying adjusting the TU program pulse until the temperature of the memory sub-system is below the high temperature threshold.

10. The apparatus of claim 8, the operations comprising:

in response to determining that the temperature of the memory sub-system is above the high temperature threshold and will not be below the high temperature threshold within the threshold period of time, adjusting the TU program pulse without delaying.

11. The apparatus of claim 8, the operations comprising:

obtaining a first temperature corresponding to a current temperature of a portion of the memory sub-system from a temperature sensor;

initializing a timer;

determining that the timer has reached a threshold value;

in response to determining that the timer has reached the threshold value, obtaining a second temperature corresponding to the current temperature of the portion of the memory sub-system from the temperature sensor;

comparing the first temperature with the second temperature;

determining that the second temperature is lower than the first temperature by more than a threshold amount; and in response to determining that the second temperature is lower than the first temperature by more than the threshold amount, determining that the temperature of the memory sub-system that is above the high temperature threshold will be below the high temperature threshold within the threshold period of time.

12. The apparatus of claim 1, the operations for accessing data comprising:

reading data from the plurality of memory cells coupled to the individual SG prior to adjusting the TU program pulse; and determining a quantity of cell bits of the plurality of memory cells that pass the SG scan based on reading the data.

13. The apparatus of claim 12, the operations comprising:

accessing a table that associates different ranges of cell bits that pass the SG scan with respective TU program pulse adjustment values;

determining that the quantity of cell bits that pass the SG scan correspond to a first range of cell bits in the table;

obtaining a TU program pulse adjustment value associated with the first range; and adjusting the TU program pulse that is applied to the individual SG based on the obtained TU program pulse adjustment.

14. The apparatus of claim 12, wherein the quantity of cell bits is computed as a total count or as a percentage of a total number of cells in the plurality of memory cells, and wherein different TU program pulse adjustments are applied to different SGs of the set of SGs corresponding to different memory blocks or memory dies.

15. The apparatus of claim 1, the operations for accessing data comprising:

reading a temperature associated with the individual SG prior to adjusting the TU program pulse; and adjusting the TU program pulse based on the temperature.

16. The apparatus of claim 15, the operations comprising:

accessing a table that associates different ranges of temperatures with respective TU program pulse adjustment values;

determining that the temperature associated with the individual SG corresponds to a first range of cell bits in the table;

obtaining a TU program pulse adjustment value associated with the first range; and adjusting the TU program pulse that is applied to the individual SG based on the obtained TU program pulse adjustment.

17. The apparatus of claim 16, wherein the temperature is computed as an actual value read from a temperature sensor or as a ratio of the actual value read to a threshold temperature value, wherein the memory sub-system comprises three-dimensional (3D) NAND memory structures and replacement-gate (RG) NAND devices.

18. The apparatus of claim 1, the operations for accessing data comprising:

reading data from the plurality of memory cells coupled to the individual SG prior to adjusting the TU program pulse;

determining a quantity of cell bits of the plurality of memory cells that pass the SG scan based on reading the data;

reading a temperature associated with the individual SG prior to adjusting the TU program pulse;

accessing a table that associates different ranges of temperatures and different ranges of cell bits that pass the SG scan with respective TU program pulse adjustment values;

obtaining a TU program pulse adjustment value associated with an individual range in the table based on the read temperature and the determined quantity of cell bits; and adjusting the TU program pulse that is applied to the individual SG based on the obtained TU program pulse adjustment.

19. A method comprising:

detecting a condition for performing a select gate (SG) scan for a set of SGs associated with a set of memory components of a memory sub-system;

in response to detecting the condition for performing the SG scan, accessing data associated with a plurality of memory cells of the set of memory components coupled to an individual SG of the set of SGs;

adjusting a touch up (TU) program pulse based on the accessed data associated with the plurality of memory cells; and applying the adjusted TU program pulse to the individual SG to place a threshold voltage (Vt) of the individual SG within a specified operating range.

20. A non-transitory computer-readable storage medium comprising instructions that, when executed by a processing device, cause the processing device to perform operations comprising:

detecting a condition for performing a select gate (SG) scan for a set of SGs associated with a set of memory components of a memory sub-system;

in response to detecting the condition for performing the SG scan, accessing data associated with a plurality of memory cells of the set of memory components coupled to an individual SG of the set of SGs;

adjusting a touch up (TU) program pulse based on the accessed data associated with the plurality of memory cells; and applying the adjusted TU program pulse to the individual SG to place a threshold voltage (Vt) of the individual SG within a specified operating range.

* * * * *